US008842769B2

(12) United States Patent
Morris

(10) Patent No.: US 8,842,769 B2
(45) Date of Patent: Sep. 23, 2014

(54) PROGRAMMABLE DIGITAL UP-CONVERSION FOR CONCURRENT MULTI-BAND SIGNALS

(75) Inventor: Bradley John Morris, Ottawa (CA)

(73) Assignee: Telefonaktiebolaget L M Ericsson (publ), Stockholm (SE)

( * ) Notice: Subject to any disclaimer, the term of this patent is extended or adjusted under 35 U.S.C. 154(b) by 0 days.

(21) Appl. No.: 13/490,801

(22) Filed: Jun. 7, 2012

(65) Prior Publication Data
US 2013/0241757 A1 Sep. 19, 2013

Related U.S. Application Data

(60) Provisional application No. 61/611,892, filed on Mar. 16, 2012.

(51) Int. Cl.
H04L 27/00 (2006.01)
(52) U.S. Cl.
USPC .......................................................... 375/295
(58) Field of Classification Search
USPC .......................................................... 375/322
See application file for complete search history.

(56) References Cited

U.S. PATENT DOCUMENTS

| 5,894,497 | A * | 4/1999 | Overton ........................ 375/295 |
| 2003/0162514 | A1* | 8/2003 | Chu et al. ....................... 455/127 |
| 2003/0199259 | A1* | 10/2003 | Macedo et al. ................ 455/141 |
| 2007/0201582 | A1 | 8/2007 | Okada et al. |
| 2008/0013639 | A1 | 1/2008 | Rick et al. |
| 2008/0238544 | A1 | 10/2008 | Morris et al. |
| 2009/0316838 | A1 | 12/2009 | Fuller et al. |
| 2010/0098191 | A1* | 4/2010 | Morris et al. ................. 375/322 |
| 2012/0046004 | A1 | 2/2012 | Mirzaei et al. |
| 2014/0028391 | A1 | 1/2014 | Morris et al. |

FOREIGN PATENT DOCUMENTS

| GB | 2476393 A | 6/2011 |
| WO | 2008009013 A2 | 1/2008 |

OTHER PUBLICATIONS

Ju Seop Lee, Microwave Resonator Filters for Advanced Wireless Systems, 2009, University of Michigan.*
Author Unknown, "E-UTRA," Wikipedia, web page last modified Nov. 4, 2012,12 pages.
International Search Report and Written Opinion for PCT/IB2013/056037, mailed Jan. 21, 2014, 13 pages.
International Search Report and Written Opinion for PCT/IB2013/052526, mailed Sep. 9, 2013, 10 pages.
International Preliminary Report on Patentability for PCT/IB2013/052526 mailed Mar. 13, 2014, 7 pages.

* cited by examiner

Primary Examiner — Chieh M Fan
Assistant Examiner — Wednel Cadeau
(74) Attorney, Agent, or Firm — Withrow & Terranova, PLLC

(57) ABSTRACT

Embodiments of a digital up-conversion system for a concurrent multi-band signal and methods of operation thereof are disclosed. In one embodiment, a digital up-conversion system includes multiple digital up-converter chains, each for a different frequency band of the concurrent multi-band signal, and a digital combiner that combines up-converted signals output by the digital up-converter chains to provide a combined digital signal. The combined digital signal is processed by one or more additional processing components including a digital-to-analog converter (DAC) to provide the concurrent multi-band signal.

19 Claims, 15 Drawing Sheets

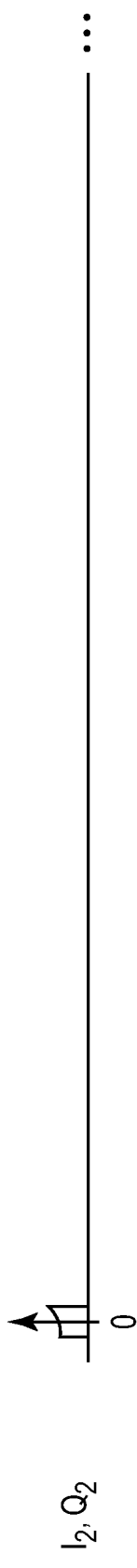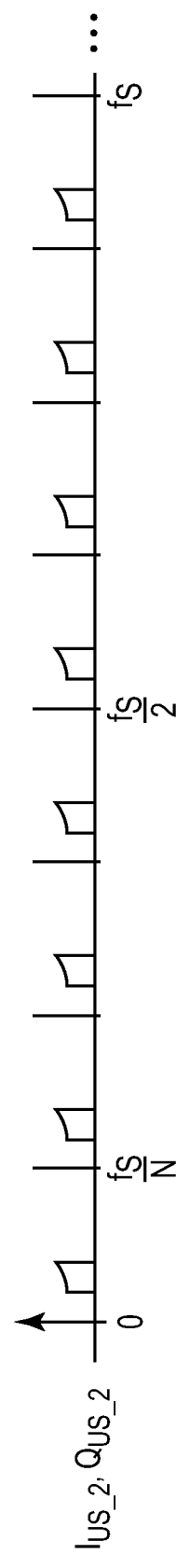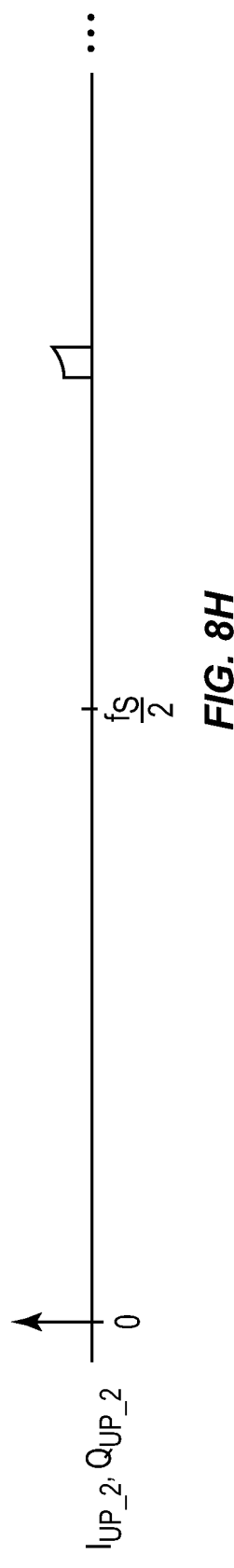

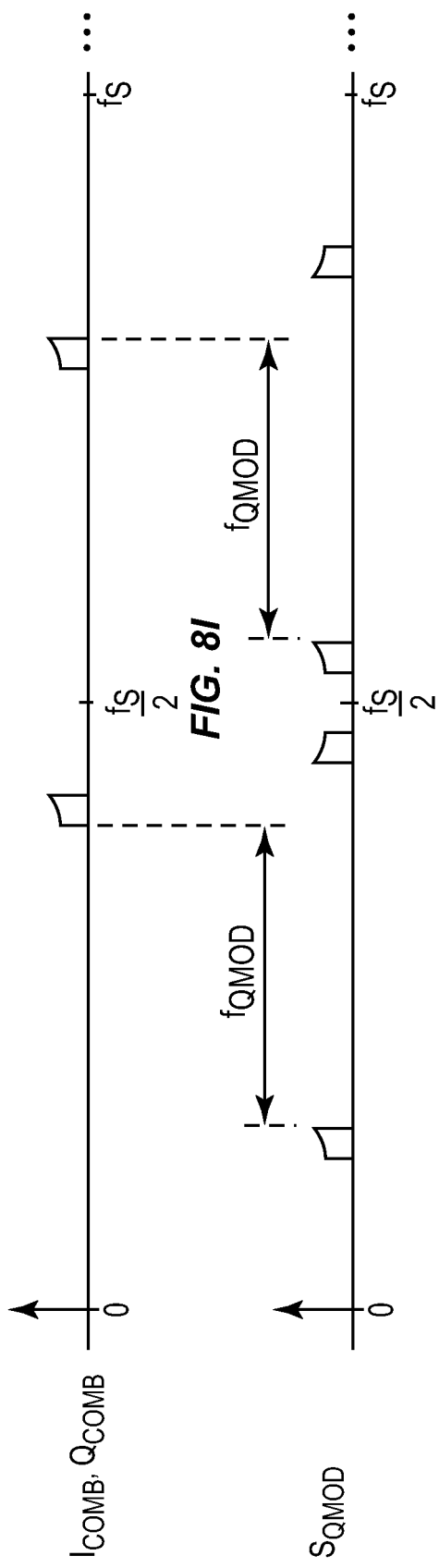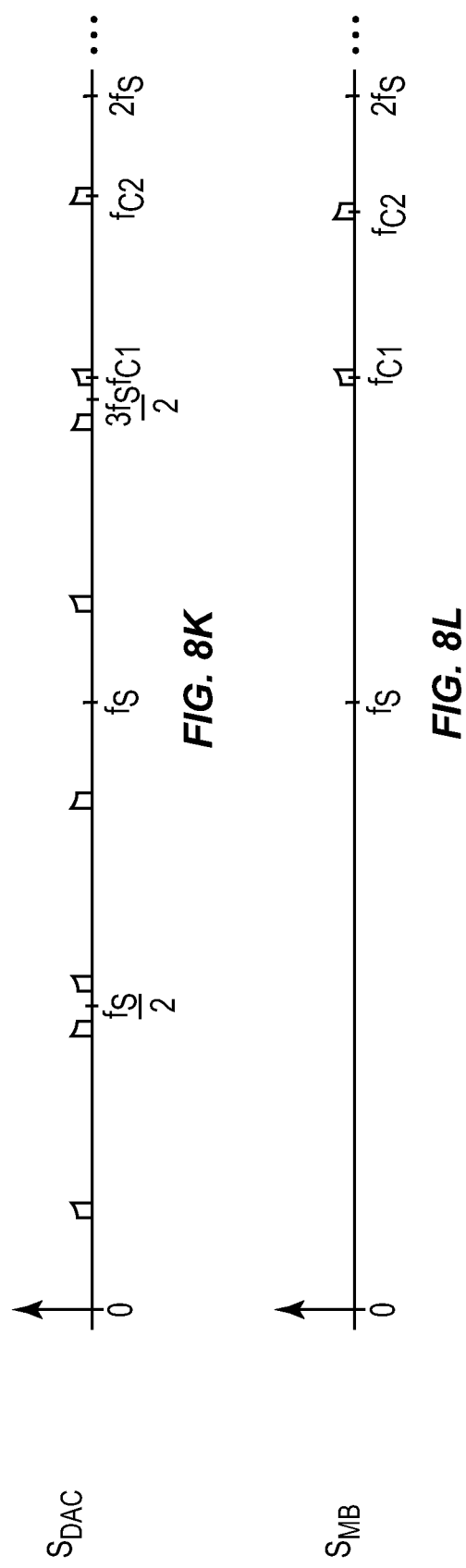

PROGRAMMABLE DIGITAL UP-CONVERSION FOR CONCURRENT MULTI-BAND SIGNALS

RELATED APPLICATIONS

This application claims the benefit of provisional patent application Ser. No. 61/611,892, filed Mar. 16, 2012, the disclosure of which is hereby incorporated herein by reference in its entirety.

FIELD OF THE DISCLOSURE

The present disclosure relates to digital up-conversion and more particularly digital up-conversion for a concurrent multi-band signal.

BACKGROUND

Traditionally, baseband to radio frequency (RF) up-conversion is performed in the analog domain with one of three types of architectures, namely, a heterodyne architecture, a super-heterodyne architecture, or a direct conversion architecture. Analog up-conversion architectures and previous attempts at digital up-conversion architectures have generally been frequency dependent in that they only operate over a small frequency band. In other words, a traditional analog up-converter that is designed for one frequency band will not operate effectively for a different frequency band. For example, an up-converter designed for operation at 800 megahertz (MHz) will not operate properly at 450 MHz, 1.5 GHz, or 1.9 gigahertz (GHz). Therefore, it is not possible for a radio designed for use in one frequency band to be converted for use in an alternate frequency band without physically replacing an up-converter in the radio with a newly designed up-converter for the alternate frequency band or having multiple up-converters each capable of operating in a different frequency band. Either option adds an increase to the cost of a system. Another disadvantage of an analog up-converter is that it is subject to issues related to analog variability such as, but not limited to, component to component variability, temperature variability, voltage variability, and variability due to aging.

A flexible, programmable digital up-conversion system that addresses the issues above is described in commonly owned and assigned U.S. Patent Application Publication No. 2010/0098191 A1, entitled METHODS AND SYSTEMS FOR PROGRAMMABLE DIGITAL UP-CONVERSION, filed on Oct. 20, 2008, and published on Apr. 22, 2010, which is hereby incorporated herein by reference in its entirety.

Further issues arise when up-converting for a concurrent multi-band signal. For instance, while the digital up-conversion system of U.S. Patent Application Publication No. 2010/0098191 A1 can be used for concurrent multi-band signals, it must treat the concurrent multi-band signal as a single wide-band signal. However, due to the large bandwidth of a concurrent multi-band signal, treating the concurrent multi-band signal as a single wide-band signal may exceed or approach processing capabilities of current Application Specific Integrated Circuit (ASIC) and Field Programmable Gate Array (FPGA) technology. Thus, there is a need for a digital up-conversion system for a concurrent multi-band signal that also addresses the other issues discussed above.

SUMMARY

Systems and methods are disclosed for digital up-conversion of a concurrent multi-band signal. As used herein, a "concurrent multi-band signal" is a signal that contains frequency components occupying multiple frequency bands (i.e., a first continuous frequency band, a second continuous frequency band, etc.) with no frequency components between adjacent frequency bands. In general, the systems and methods disclosed herein make use of complex tuning at baseband, up-sampling, and digital filtering to create a flexible digital up-conversion system for a concurrent multi-band signal.

In one embodiment, a digital up-conversion system for a concurrent multi-band signal includes multiple digital up-converter chains, each for a different frequency band of the concurrent multi-band signal, and a digital combiner that combines up-converted signals output by the digital up-converter chains to provide a combined digital signal. The combined digital signal is processed by one or more additional processing components including a digital-to-analog converter (DAC) to provide the concurrent multi-band signal.

In one embodiment, one or more parameters of the digital up-converter chains are configured based on an effective sampling rate of the DAC such that, after processing by the one or more additional processing components, complex digital baseband signals for the frequency bands of the concurrent multi-band signal are up-converted to desired carrier frequencies of the corresponding frequency bands of the concurrent multi-band signal. In another embodiment, the effective sampling rate of the DAC is configured based on one or more predefined parameters of the digital up-converter chains such that, after processing by the one or more additional processing components, complex digital baseband signals for the frequency bands of the concurrent multi-band signal are up-converted to desired carrier frequencies of the corresponding frequency bands of the concurrent multi-band signal.

In one embodiment, each digital up-converter chain includes one or more digital up-converter stages and a digital quadrature modulator. For each digital up-converter chain, the one or more digital up-converter stages of the digital up-converter chain process a complex baseband signal for the corresponding frequency band of the concurrent multi-band signal to produce an output signal that includes an image of the complex baseband signal centered at a desired output frequency for the one or more digital up-converter stages. The digital quadrature modulator then processes the output signal of the one or more digital up-converter stages to provide the up-converted signal output by the digital up-converter chain. In the frequency domain, the digital quadrature modulation of the output signal results in frequency translating, or frequency-shifting, the image of the complex baseband signal to a desired up-conversion frequency for the digital up-converter chain. The desired up-conversion frequencies for the digital up-converter chains are such that, after processing of the combined signal by the one or more additional processing components including the DAC, images of the complex baseband signals are centered at the desired carrier frequencies of the corresponding frequency bands of the concurrent multi-band signal.

In another embodiment, each digital up-converter chain includes one or more digital up-converter stages. For each digital up-converter chain, the one or more digital up-converter stages of the digital up-converter chain process a complex baseband signal for the corresponding frequency band of the concurrent multi-band signal to produce the up-converted signal output by the digital up-converter chain such that the up-converted signal includes an image of the complex baseband signal centered at a desired up-conversion frequency for the digital up-converter chain. The desired up-conversion frequencies for the digital up-converter chains are such that, after processing of the combined signal by the one or more additional processing components including a digital quadrature modulator followed by the DAC, images of the complex baseband signals are centered at center frequencies of the corresponding frequency bands of the concurrent multiband signal.

Further, in one embodiment, each complex up-converter stage of each digital up-converter chain includes a complex baseband tuner followed by an up-sampler and an image selection filter. For each digital up-converter chain, a baseband tuning frequency of the complex baseband tuner and a tuning frequency of the image selection filter for at least one of the complex up-converter stages in the digital up-converter chain are selected based on the effective sampling rate of the DAC such that, after processing of the combined signal by the one or more additional processing components including the DAC, an image of the complex baseband signal input to the digital up-converter chain is centered at a desired carrier frequency of the corresponding frequency band of the concurrent multi-band signal. In another embodiment, one or more parameters of the one or more additional processing components (e.g., the effective sampling rate of the DAC) are configured based on predetermined tuning frequencies of the image selection filters in the digital up-converter chains, and subsequently baseband tuning frequencies of the complex baseband tuners are determined such that, after processing of the combined signal by the one or more additional processing components including the DAC, images of the complex baseband signals input to the digital up-converter chains are centered at desired carrier frequencies of the corresponding frequency bands of the concurrent multi-band signal.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

FIGS. 8A through 8L are frequency domain diagrams that graphically illustrate the operation of the digital up-conversion system of FIG. 7 according to one embodiment of the present disclosure;

Figure 7:
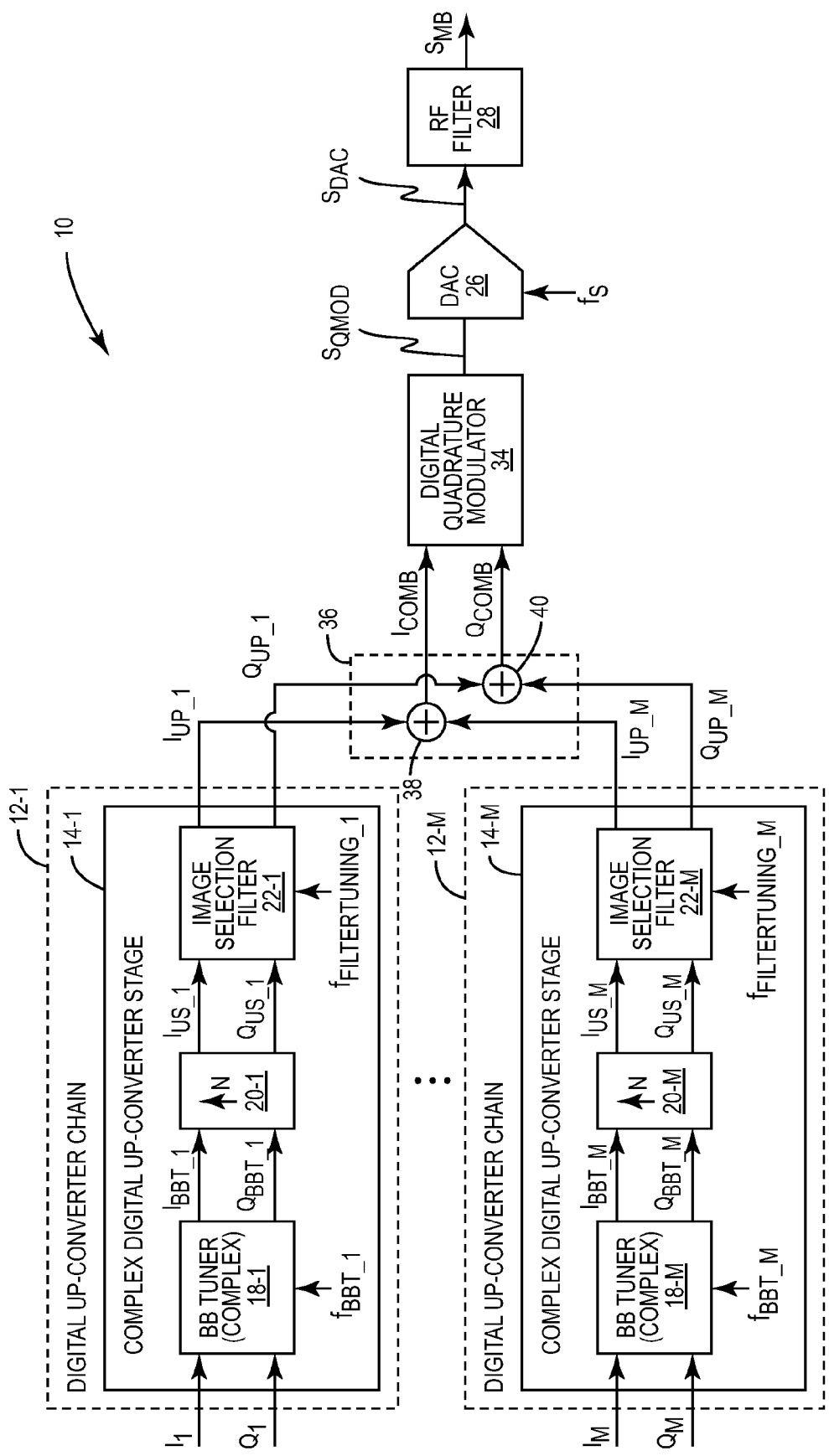
FIG. 7 illustrates a digital up-conversion system for a concurrent multi-band signal that is similar to that of FIG. 1 but where digital quadrature modulation is performed after, rather than before, digitally combining outputs of the digital up-converter chains according to another embodiment of the present disclosure.
Figure 9:
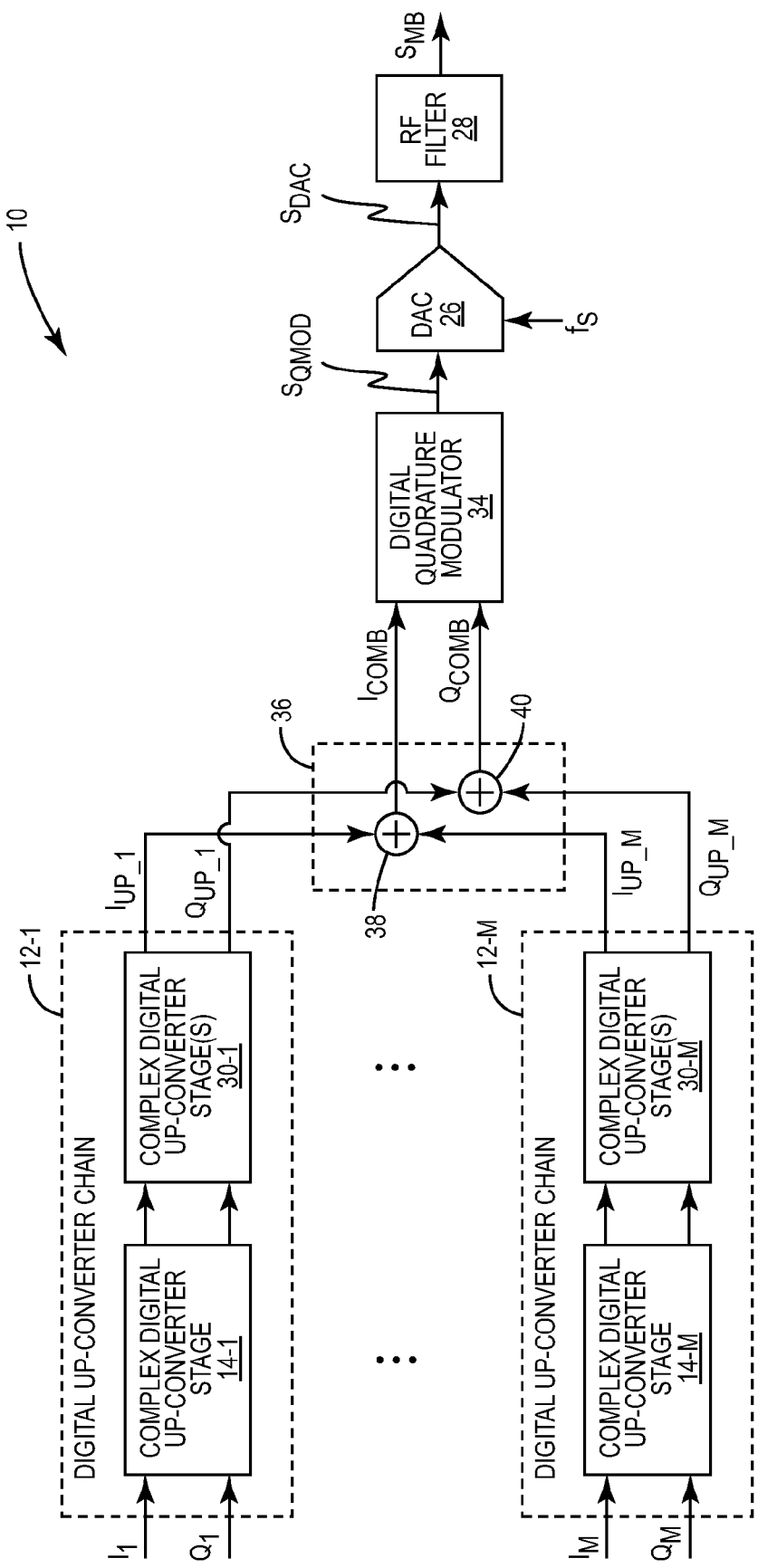
FIG. 9 illustrates a digital up-conversion for a concurrent multi-band signal that is similar to that of FIG. 7 but where each digital up-converter chain can include multiple complex digital up-converter stages according to another embodiment of the present disclosure.
Figure 10:
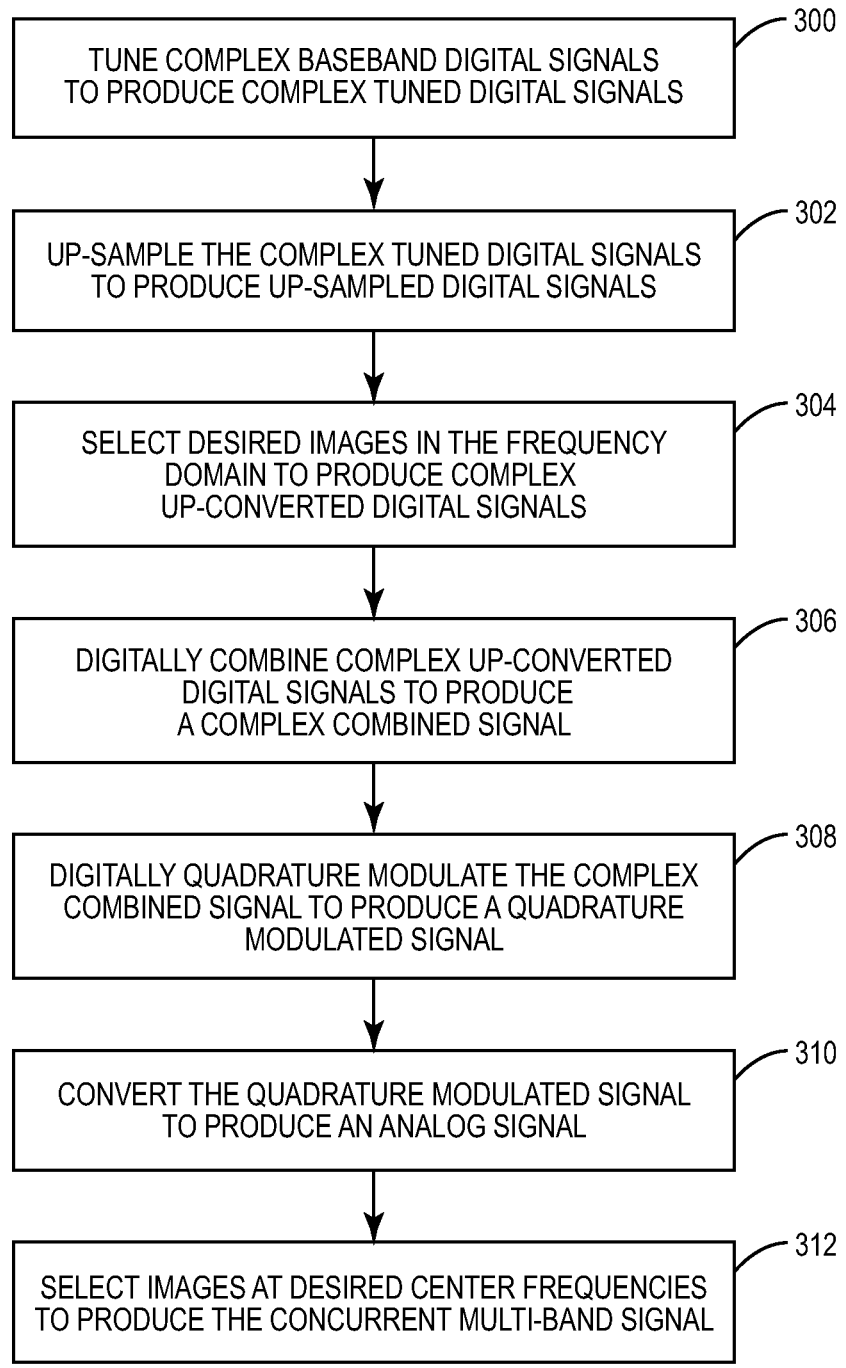
Figure 11:
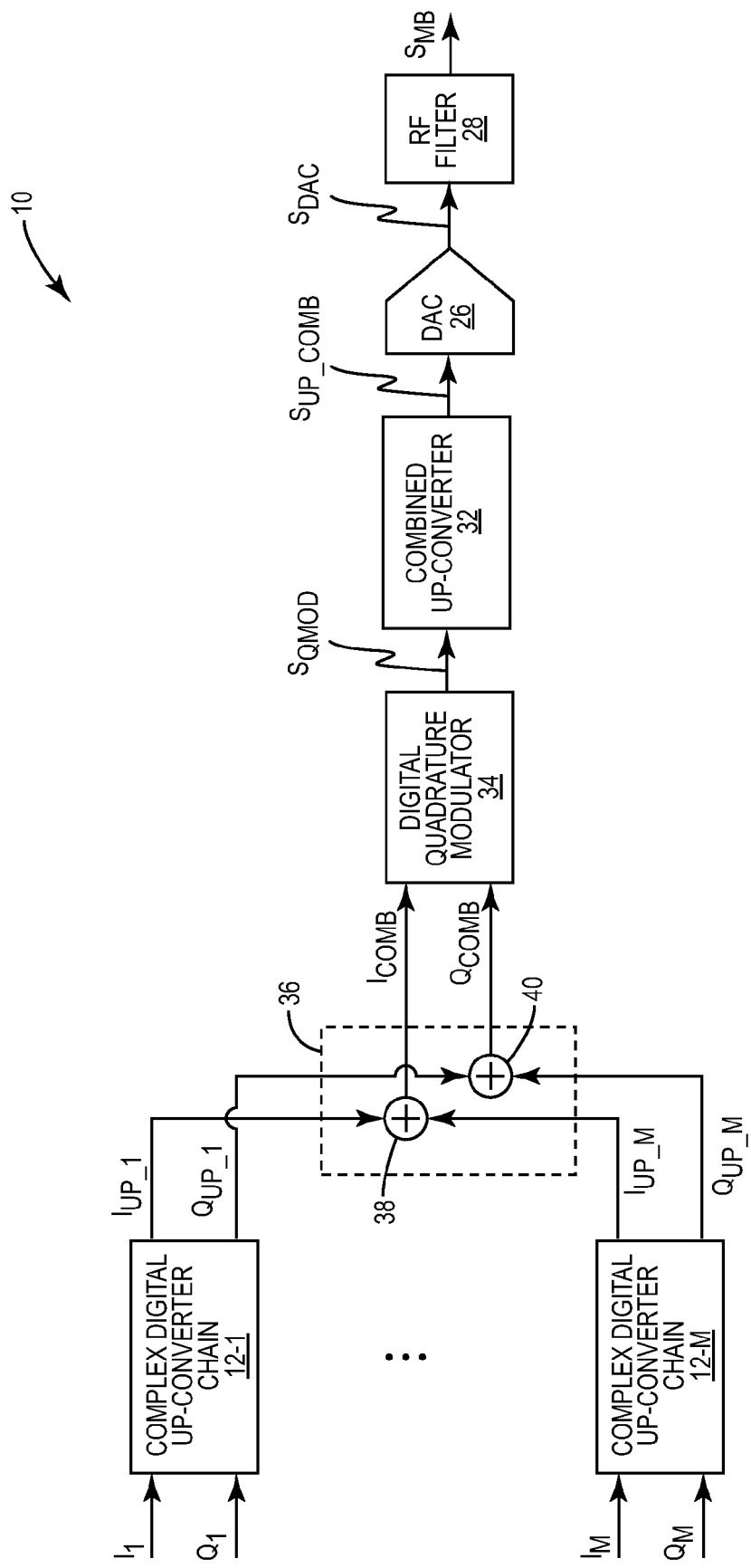

FIG. 10 is a flow chart illustrating the operation of the digital up-conversion systems of FIGS. 7 and 9 according to one embodiment of the present disclosure; and FIG. 11 illustrates a digital up-conversion for a concurrent multi-band signal that is similar to that of FIGS. 7 and 9 but where an additional combined up-converter performs further up-conversion of the combined signal according to another embodiment of the present disclosure.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

Figure 1:
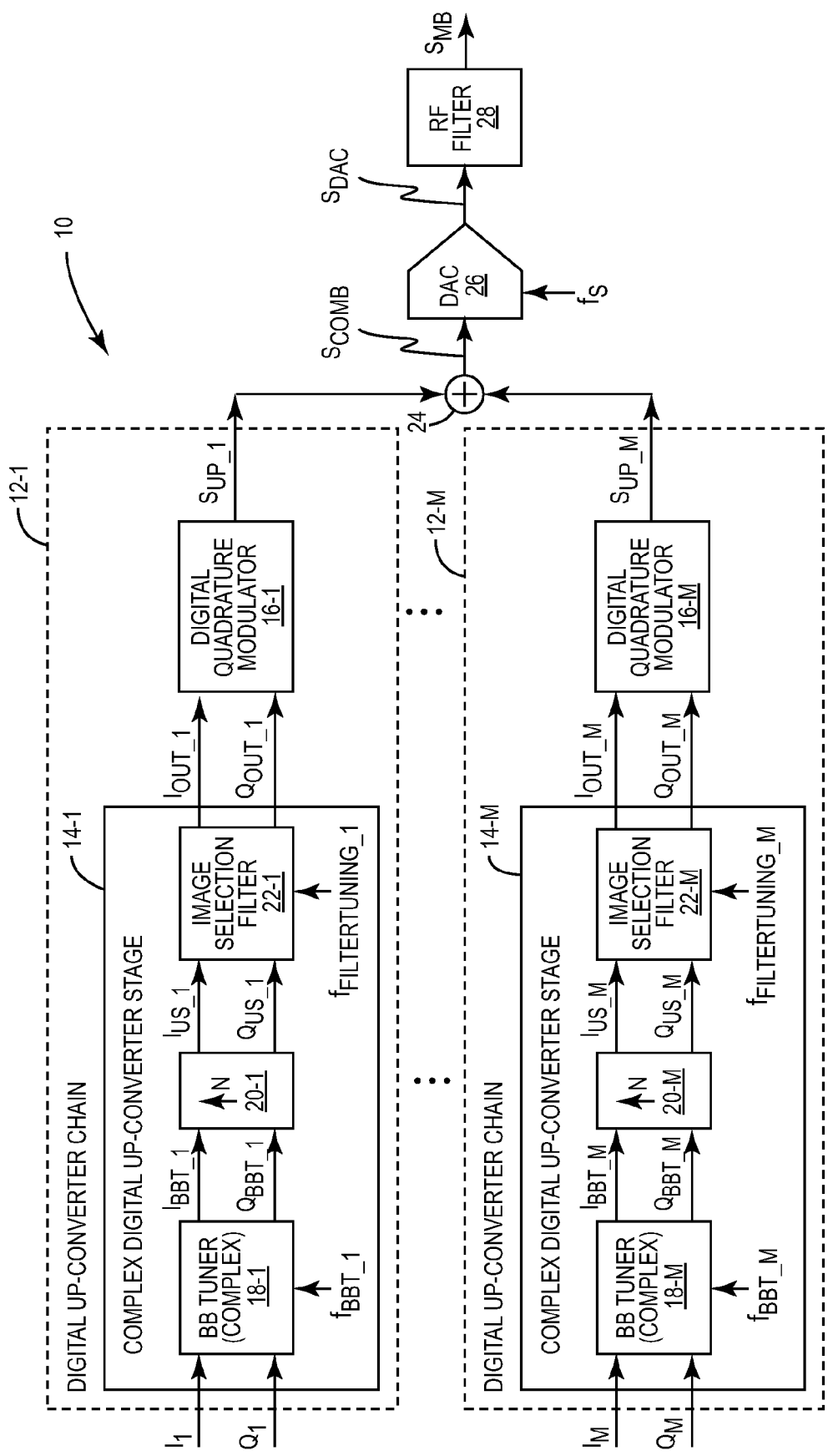
FIG. 1 illustrates a digital up-conversion system for a concurrent multi-band signal according to one embodiment of the present disclosure.

FIG. 1 illustrates a programmable concurrent multi-band digital up-conversion system 10 according to one embodiment of the present disclosure. In general, the digital up-conversion system 10 operates to digitally up-convert a number (M) of complex baseband digital signals ($I_1$, $Q_1$ through $I_M$, $Q_M$) to provide a concurrent multi-band signal ($S_{MB}$). As used herein, a concurrent multi-band signal, such as the concurrent multi-band signal ($S_{MB}$), is a signal that contains frequency components occupying multiple frequency bands (i.e., a first continuous frequency band, a second continuous frequency band, etc.) with no frequency components between adjacent frequency bands. These frequency bands are referred to herein as "frequency bands" of the concurrent multi-band signal. In one embodiment, the concurrent multi-band signal includes two frequency bands and, as such, is also referred to herein as a concurrent dual-band signal.

For each frequency band of the concurrent multi-band signal, a center frequency of the frequency band is referred to herein as a carrier frequency of the concurrent multi-band signal. As such, the concurrent multi-band signal as defined herein includes multiple carrier frequencies. Frequency differences between adjacent carrier frequencies of the concurrent multi-band signal are referred to herein as carrier frequency spacings. A ratio of the carrier frequency spacing over a maximum individual baseband bandwidth (i.e., the maximum individual baseband bandwidth is a maximum bandwidth among the baseband signals that correspond to the frequency bands of the concurrent multi-band signal) is high such that a distortion or predistortion surrounding each of the carrier frequencies also occupies disjoint frequency bands. Some examples of situations or applications where such concurrent multi-band signals are used include multi-standard systems where each standard occupies a different frequency band, systems that transmit signals for multiple standards simultaneously, and systems having concurrent transmissions in multiple frequency bands for the same standard.

The digital up-conversion system 10 includes M digital up-converter chains 12-1 through 12-M, where again M is the number of frequency bands in the concurrent multi-band signal ($S_{MB}$) and is greater than or equal to 2. The digital up-converter chains 12-1 through 12-M may also be generally referred to herein collectively as digital up-converter chains 12 or individually as a digital up-converter chain 12. Each of the digital up-converter chains 12-1 through 12-M performs digital up-conversion for a different one of the frequency bands of the concurrent multi-band signal ($S_{MB}$). More specifically, the digital up-converter chain 12-1 digitally up-converts the complex baseband digital signal ($I_1$, $Q_1$) for a first frequency band of the concurrent multi-band signal ($S_{MB}$) to provide a corresponding up-converted digital signal ($S_{UP\_1}$). Likewise, the digital up-converter chain 12-M digitally up-converts the complex baseband signal ($I_M$, $Q_M$) for an Mth frequency band of the concurrent multi-band signal ($S_{MB}$) to provide a corresponding up-converted digital signal ($S_{UP\_M}$).

The digital up-converter chains 12-1 through 12-M include corresponding complex digital up-converter stages 14-1 through 14-M (generally referred to herein collectively as complex digital up-converter stages 14 and individually as complex digital up-converter stage 14) and corresponding digital quadrature modulators 16-1 through 16-M (generally referred to herein collectively as digital quadrature modulators 16 and individually as a digital quadrature modulator 16). In this embodiment, each of the digital up-converter chains 12 includes one complex digital up-converter stage 14. However, as discussed below, one or more or even all of the digital up-converter chains 12 may include one or more additional complex digital up-converter stages.

As illustrated, the complex digital up-converter stages 14-1 through 14-M include complex baseband tuners 18-1 through 18-M, up-samplers 20-1 through 20-M, and image selection filters 22-1 through 22-M, respectively, which are also generally referred to herein as complex baseband tuners 18, up-samplers 20, and image selection filters 22. Looking first at the complex digital up-converter stage 14-1 of the digital up-converter chain 12-1, the complex baseband tuner 18-1 first performs a complex tuning of the complex baseband digital signal ($I_1$, $Q_1$) for the first frequency band of the concurrent multi-band signal ($S_{MB}$). Preferably, a sampling rate of the complex baseband digital signal ($I_1$, $Q_1$) is $f_S/N$. Alternatively, sampling rate conversion may be utilized to convert the sampling rate of the complex baseband digital signal ($I_1$, $Q_1$) to $f_S/N$ prior to complex baseband tuning. Note that if rate conversion is needed, the rate conversion may alternatively be performed elsewhere in the digital up-conversion system 10 prior to a digital-to-analog converter (DAC) 26 (e.g., subsequent to the complex baseband tuner 18-1, subsequent to the up-sampler 20-1, subsequent to the image selection filter 22-1, subsequent to the digital quadrature modulator 16-1, or prior to the DAC 26).

As discussed below in detail, the complex baseband tuner 18-1 tunes the complex baseband digital signal ($I_1$, $Q_1$) to a baseband tuning frequency ($f_{BBT\_1}$) to thereby produce a complex tuned digital signal ($I_{BBT\_1}$, $Q_{BBT\_1}$). In one embodiment, the baseband tuning frequency ($f_{BBT\_1}$) is programmable or otherwise selectable within a range of $-f_S/2N$ and $f_S/2N$, as discussed below in detail, where $f_S$ is an effective sampling rate of the DAC 26 and N is an up-sampling rate of the up-sampler 20-1. The complex baseband tuner 18-1 is preferably utilized to provide fine tuning to achieve the desired carrier frequency for the corresponding frequency band of the concurrent multi-band signal. A particular example of a complex baseband tuner is described in commonly owned and assigned U.S. Patent Application Publication No. 2009/0316838 A1, entitled CORDIC BASED COMPLEX TUNER WITH EXACT FREQEUNCY RESOLUTION, filed on Jun. 23, 2008 and published on Dec. 24, 2009, is hereby incorporated herein by reference in its entirety.

The up-sampler 20-1 up-samples the complex tuned digital signal ($I_{BBT\_1}$, $Q_{BBT\_1}$) at an up-sampling rate N, where N≥2, to produce an up-sampled digital signal ($I_{US\_1}$, $Q_{US\_1}$) having a sampling rate of $f_S$. In the frequency domain, the up-sampled digital signal ($I_{US\_1}$, $Q_{US\_1}$) includes N images of the complex tuned digital signal ($I_{BBT\_1}$, $Q_{BBT\_1}$) equally spaced apart in the frequency range of 0 to $f_S$, where $f_S$ is the effective sampling rate of the DAC 26. The up-sampler 20-1 is preferably utilized to provide coarse tuning to achieve the desired carrier frequency for the corresponding frequency band of the concurrent multi-band signal. The image selection filter 22-1 filters the up-sampled digital signal ($I_{US\_1}$, $Q_{US\_1}$) to select a desired one of the images of the complex tuned digital signal ($I_{BBT\_1}$, $Q_{BBT\_1}$) and thereby provide a complex output signal of the complex digital up-converter stage 14-1 ($I_{OUT\_1}$, $Q_{OUT\_1}$). More specifically, the image selection filter 22-1 is preferably programmable via one or more parameters (e.g., filter coefficients) such that a passband of the image selection filter 22-1 is centered at a desired filter tuning frequency ($f_{FILTERTUNING\_1}$). The filter tuning frequency ($f_{FILTERTUNING\_1}$) is selected such that the desired image of the complex tuned digital signal ($I_{BBT\_1}$, $Q_{BBT\_1}$) falls within the passband of the image selection filter 22-1.

The digital quadrature modulator 16-1 performs quadrature modulation on the complex output signal ($I_{OUT\_1}$, $Q_{OUT\_1}$) to provide the up-converted digital signal ($S_{UP\_1}$) output by the digital up-converter chain 12-1. In the frequency domain, quadrature modulation results in frequency translating, or frequency-shifting, the image of the complex tuned digital signal ($I_{BBT\_1}$, $Q_{BBT\_1}$) in the complex output signal ($I_{OUT\_1}$, $Q_{OUT\_1}$) by $f_{QMOD}$, where $f_{QMOD}$ is a modulation frequency of the digital quadrature modulator 16-1, and converting the complex signal into a real signal. Note, however, that $f_{QMOD}$ may be any frequency including zero. In one preferred embodiment, $f_{QMOD}$ is equal to $\pm f_S/4$. In another embodiment, $f_{QMOD}$ is equal to zero in which case there is no frequency translation of the image of the complex tuned digital signal ($I_{BBT\_1}$, $Q_{BBT\_1}$) in the complex output signal ($I_{OUT\_1}$, $Q_{OUT\_1}$). It should be further noted that $f_{QMOD}=0$ takes just the real component of the complex output, where the imaginary part may need to be previously inverted depending on the desired sign of the quadrature modulation. The frequency-translated image of the complex tuned digital signal ($I_{BBT\_1}$, $Q_{BBT\_1}$) is centered at a desired up-conversion frequency for the digital up-converter chain 12-1.

Similarly, regarding the complex digital up-converter stage 14-M of the digital up-converter chain 12-M, the complex baseband tuner 18-M first performs a complex tuning of the complex baseband digital signal ($I_M$, $Q_M$) for the Mth frequency band of the concurrent multi-band signal ($S_{MB}$). Preferably, a sampling rate of the complex baseband digital signal ($I_M$, $Q_M$) is $f_S/N$. Alternatively, sampling rate conversion may be utilized to convert the sampling rate of the complex baseband digital signal ($I_M$, $Q_M$) to $f_S/N$ prior to complex baseband tuning. Note that if rate conversion is needed, the rate conversion may alternatively be performed elsewhere in the digital up-conversion system 10 prior to the DAC 26 (e.g., subsequent to the complex baseband tuner 18-M, subsequent to the up-sampler 20-M, subsequent to the image selection filter 22-M, subsequent to the digital quadrature modulator 16-M, or prior to the DAC 26).

As discussed below in detail, the complex baseband tuner 18-M first performs a complex tuning of the complex baseband digital signal ($I_M$, $Q_M$) for the Mth frequency band of the concurrent multi-band signal ($S_{MB}$). As discussed below in detail, the complex baseband tuner 18-M tunes the complex baseband digital signal ($I_M$, $Q_M$) to a baseband tuning frequency ($f_{BBT\_M}$) to thereby produce a complex tuned digital signal ($I_{BBT\_M}$, $Q_{BBT\_M}$). In one embodiment, the baseband tuning frequency ($f_{BBT\_M}$) is programmable or otherwise selectable within a range of $-f_S/2N$ and $f_S/2N$, as discussed below in detail, where $f_S$ is the effective sampling rate of the DAC 26 and N is an up-sampling rate of the up-sampler 20-M.

The up-sampler 20-M up-samples the complex tuned digital signal ($I_{BBT\_M}$, $Q_{BBT\_M}$) at an up-sampling rate N, where N≥2, to produce an up-sampled digital signal ($I_{US\_M}$, $Q_{US\_M}$) having a sampling rate of $f_S$. In the frequency domain, the up-sampled digital signal ($I_{US\_M}$, $Q_{US\_M}$) includes N images of the complex tuned digital signal ($I_{BBT\_M}$, $Q_{BBT\_M}$) equally spaced apart in the frequency range of 0 to $f_S$, where $f_S$ is the effective sampling rate of the DAC 26. The image selection filter 22-M filters the up-sampled digital signal ($I_{US\_M}$, $Q_{US\_M}$) to select a desired one of the images of the complex tuned digital signal ($I_{BBT\_M}$, $Q_{BBT\_M}$) and thereby provide a complex output signal ($I_{OUT\_M}$, $Q_{OUT\_M}$) of the complex digital up-converter stage 14-M. More specifically, the image selection filter 22-M is preferably programmable via one or more parameters (e.g., filter coefficients) such that a passband of the image selection filter 22-M is centered at a desired filter tuning frequency ($f_{FILTERTUNING\_M}$). The filter tuning frequency ($f_{FILTERTUNING\_M}$) is selected such that the desired image of the complex tuned digital signal ($I_{BBT\_M}$, $Q_{BBT\_M}$) falls within the passband of the image selection filter 22-M.

The digital quadrature modulator 16-M performs quadrature modulation on the complex output signal ($I_{OUT\_M}$, $Q_{OUT\_M}$) to provide the up-converted digital signal ($S_{UP\_M}$) output by the digital up-converter chain 12-M. In the frequency domain, quadrature modulation results in frequency translating, or frequency-shifting, the image of the complex tuned digital signal ($I_{BBT\_M}$, $Q_{BBT\_M}$) in the complex output signal ($I_{OUT\_M}$, $Q_{OUT\_M}$) by $f_{QMOD}$, where $f_{QMOD}$ is a modulation frequency of the digital quadrature modulator 16-M, and converting the complex signal into a real signal. Again, $f_{QMOD}$ can be any desired frequency including zero. Note that the modulation frequencies of the digital quadrature modulators 16 may all be the same or, alternatively, one or more of the digital quadrature modulators 16 may have different modulation frequencies. The frequency-translated image of the complex tuned digital signal ($I_{BBT\_M}$, $Q_{BBT\_M}$) is centered at a desired up-conversion frequency for the digital up-converter chain 12-M.

Notably, the digital quadrature modulators 16 may be configurable to operate on a definition of quadrature modulation as a+jb or a−jb. This may be desirable because, for example, different cellular communication standards (e.g., Code Division Multiple Access (CDMA) 2000 and $3^{rd}$ Generation Partnership Project (3GPP)) may define quadrature modulation differently. Therefore, in order to accommodate different communication standards, the digital quadrature modulator 16 may be configurable in this manner. Alternatively, this configuration may be handled in the modem that generates the complex baseband digital signals ($I_1$, $Q_1$ through $I_M$, $Q_M$) by a complex conjugate function prior to the complex baseband tuners 18-1 through 18-M that can be activated or deactivated as needed, or in the analog domain (i.e., after the DAC 26) which is possible if there are two DACs 26, namely, one DAC 26 for I and one DAC 26 for Q. Further, in one embodiment, the digital quadrature modulators 16 are combined with the corresponding image selection filters 22.

For more information regarding some example implementations of the complex baseband tuners 18, the up-samplers 20, the image selection filters 22, and the digital quadrature modulators 16, the interested reader is directed to commonly owned and assigned U.S. Patent Application Publication No. 2010/0098191 A1, entitled METHODS AND SYSTEMS FOR PROGRAMMABLE DIGITAL UP-CONVERSION, filed on Oct. 20, 2008 and published on Apr. 22, 2010, which has been incorporated herein by reference in its entirety. For example, while the up-sampler 20 and the image selection filter 22 of each complex digital up-converter stage 14 may be implemented as separate components, they are not limited thereto. The up-sampler 20 and the image selection filter 22 may alternatively be implemented together as a polyphase filter that performs both up-sampling and image selection filtering.

The up-converted digital signals ($S_{UP\_1}$ through $S_{UP\_M}$) are combined by a digital combiner 24 to provide a combined signal ($S_{COMB}$). The DAC 26 receives the combined signal ($S_{COMB}$) from the digital combiner 24 and converts the combined signal ($S_{COMB}$) to an analog signal ($S_{DAC}$) at the effective sampling rate ($f_S$) of the DAC 26. Notably, as used herein, a "digital" signal is a discrete time signal, whereas an "analog" signal is a continuous time signal. Further, the term "effective" is used to define that the DAC 26 may receive a signal input having a sampling rate of $f_S$ or may receive multiple parallel inputs P, each with a sampling rate of $f_S/P$, such that in combination the sampling rate processed by the DAC 26 is $f_S$. Such parallel inputs may be carried by, for example, one or more higher rate serial links. When considering the frequency domain, digital-to-analog conversion by the DAC 26 also generates images of the spectrum occurring between DC and $f_S$ repeatedly in the positive and negative frequency directions. More specifically, the spectrum of DC to $f_S$ is repeated in the positive direction between $f_S$ and $2f_S$, $2f_S$ and $3f_S$, etc. and in the negative frequency direction between 0 and $-f_S$, $-f_S$ and $-2f_S$, $-2f_S$ and $-3f_S$, etc.

In one embodiment, the effective sampling rate ($f_S$) of the DAC 26 is predetermined and potentially fixed. However, in another embodiment, the effective sampling rate ($f_S$) of the DAC 26 is configurable. In either case, the effective sampling rate ($f_S$) of the DAC 26 is preferably sufficient to at least be able to convert the concurrent multi-band signal ($S_{MB}$) plus a separation bandwidth between a first frequency band of the concurrent multi-band signal ($S_{MB}$) and a second frequency band of the concurrent multi-band signal ($S_{MB}$).

The DAC 26 may be operated in a baseband mode (or more generically a sinc mode) if it is desired to up-convert the signal to a location in the first Nyquist zone (i.e., frequency from DC to $f_S/2$). A DAC operated in the baseband mode has a frequency response that produces a useful output in the first Nyquist zone. If the DAC 26 supports a radio frequency (RF) mode (or more generically a modified sinc mode), then the DAC 26 can be used to up-convert the signal in the second Nyquist zone (i.e., frequency from $f_S/2$ to $f_S$), the third Nyquist zone (i.e., frequency from $f_S$ to $3f_S/2$), or possibly the fourth or higher Nyquist zone. In some embodiments, a DAC that supports an RF mode can do so due to a configurable output stage adapted to modify the frequency response of the DAC in the second and third Nyquist zones and/or higher Nyquist zones to be amenable to operation in these zones. The zone that is targeted will depend on one or more factors, such as, but not limited to, the desired up-conversion frequencies for the frequency bands of the concurrent multi-band signal ($S_{MB}$), the maximum sampling rate of the DAC 26, the performance capabilities of the DAC 26, and the overall desired performance of the digital up-conversion system 10.

An RF filter 28 filters the analog signal ($S_{DAC}$) from the DAC 26 to provide the concurrent multi-band signal ($S_{MB}$). More specifically, the RF filter 28 passes the images of the complex tuned digital signals ($I_{BBT\_1}$, $Q_{BBT\_1}$ through $I_{BBT\_M}$, $Q_{BBT\_M}$) centered at the desired carrier frequencies of the frequency bands of the concurrent multi-band signal ($S_{MB}$) while attenuating, or removing, the remaining undesired images and frequency-flipped images of the complex tuned digital signals ($I_{BBT\_1}$, $Q_{BBT\_1}$ through $I_{BBT\_M}$, $Q_{BBT\_M}$). For each frequency band of the concurrent multi-band signal ($S_{MB}$), the desired image may be below the sampling rate $f_S$ of the DAC 26 (e.g., in the first or second Nyquist zones) or above the sampling rate $f_S$ of the DAC 26 (e.g., in the third or higher Nyquist zone). The RF filter 28 may be implemented as a single concurrent multi-band filter or, alternatively, the RF filter 28 may be implemented as a number of parallel filters. More specifically, in one particular embodiment, a splitter provides the analog signal ($S_{DAC}$) to each of M parallel filters, each configured to provide filtering for a corresponding frequency band of the concurrent multi-band signal ($S_{MB}$). The resulting filtered signals are then combined to provide the concurrent multi-band signal ($S_{MB}$).

Before proceeding, it should be noted that, while not illustrated, other components (e.g., rate change filter(s)) may be included in the digital up-converter chains 12 and/or in the combined chain (i.e., the components after the digital combiner 24). Further, in some embodiments, the various components may be in a different order than that illustrated in FIG. 1. For example, in an alternative embodiment, the digital quadrature modulators 16 may be placed between the complex baseband tuners 18 and the up-samplers 20. Also, in some embodiments, some or all of the components of the digital up-conversion system 10 are implemented using one or more Field Programmable Gate Arrays (FPGAs), one or more Application Specific Integrated Circuits (ASICs), or the like, or any combination thereof.

As discussed below, in one embodiment, the baseband tuning frequencies ($f_{BBT\_1}$ through $f_{BBT\_M}$) and the filter tuning frequencies ($f_{FILTERTUNING\_1}$ through $f_{FILTERTUNING\_M}$) are selected based on a predetermined and potentially fixed effective sampling rate ($f_S$) of the DAC 26 such that the complex baseband digital signals ($I_1$, $Q_1$ through $I_M$, $Q_M$) are up-converted to the desired carrier frequencies of the concurrent multi-band signal ($S_{MB}$). More specifically, the baseband tuning frequencies ($f_{BBT\_1}$ through $f_{BBT\_M}$) and the filter tuning frequencies ($f_{FILTERTUNING\_1}$ through $f_{FILTERTUNING\_M}$) are selected such that images of the complex baseband digital signals ($I_1$, $Q_1$ through $I_M$, $Q_M$) in the up-converted digital signals ($S_{UP\_1}$ through $S_{UP\_M}$) are located at desired up-conversion frequencies. The desired up-conversion frequencies are such that, after further processing of the combined signal ($S_{COMB}$) by the digital combiner 24, the DAC 26, and the RF filter 28, images of the complex baseband digital signals ($I_1$, $Q_1$ through $I_M$, $Q_M$) are located at the desired carrier frequencies of the corresponding frequency bands of the concurrent multi-band signal ($S_{MB}$). Alternatively, the effective sampling rate ($f_S$) of the DAC 26 may be configurable and selected based on predetermined values for the filter tuning frequencies ($f_{FILTERTUNING\_1}$ through $f_{FILTERTUNING\_M}$) and subsequently the baseband tuning frequencies ($f_{BBT\_1}$ through $f_{BBT\_M}$) are determined such that, after processing of the combined signal ($S_{COMB}$) by the digital combiner 24, the DAC 26, and the RF filter 28, images of the complex baseband digital signals ($I_1$, $Q_1$ through $I_M$, $Q_M$) are located at the desired carrier frequencies of the corresponding frequency bands of the concurrent multi-band signal ($S_{MB}$).

Figure 2A:
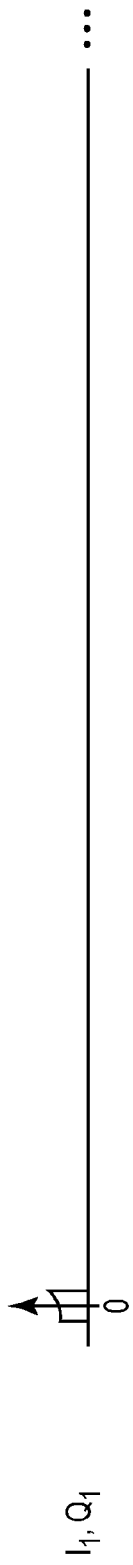
FIGS. 2A through 2M are frequency domain diagrams that graphically illustrate the operation of the digital up-conversion system of FIG. 1 according to one embodiment of the present disclosure.
Figure 2B:
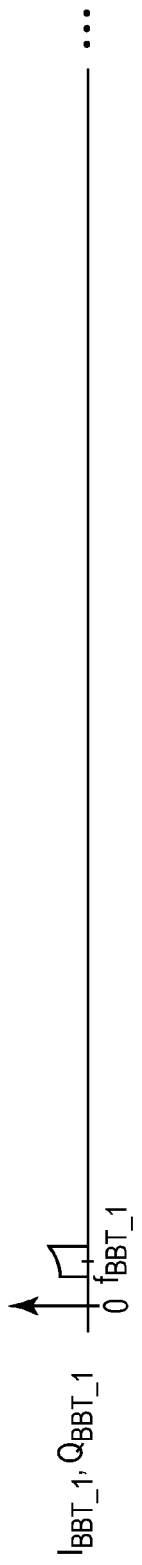
Figure 2C:
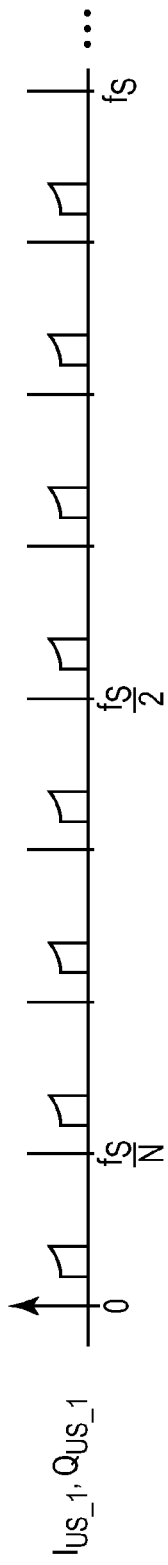
Figure 2D:
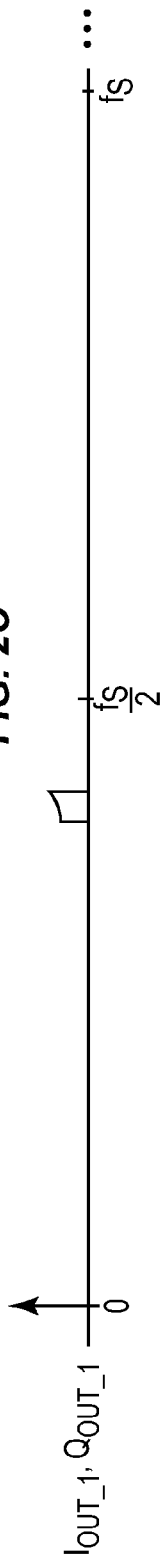
Figure 2E:
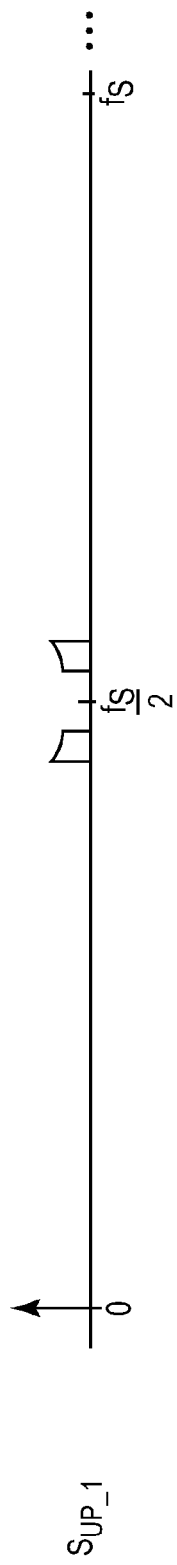

FIGS. 2A through 2M are frequency-domain diagrams that graphically illustrate the operation of the digital up-conversion system 10 of FIG. 1 for one example where the concurrent multi-band signal ($S_{MB}$) is a concurrent dual-band signal. FIGS. 2A through 2E illustrate the operation of the digital up-converter chain 12-1 for the first band of the concurrent dual-band signal. As illustrated in FIG. 2A, the complex baseband digital signal ($I_1$, $Q_1$) is centered at DC. The complex baseband tuner 18-1 tunes the complex baseband digital signal ($I_1$, $Q_1$) to the baseband tuning frequency ($f_{BBT\_1}$), as illustrated in FIG. 2B. After up-sampling by the up-sampler 20-1, the up-sampled digital signal ($I_{US\_1}$, $Q_{US\_1}$) includes N equally spaced images of the complex tuned digital signal ($I_{BBT\_1}$, $Q_{BBT\_1}$) between DC and $f_S$, wherein in this example N=8, as illustrated in FIG. 2C. The image selection filter 22-1 then filters the up-sampled digital signal ($I_{US\_1}$, $Q_{US\_1}$) to select the desired image, as illustrated in FIG. 2D. Finally, after digital quadrature modulation, the image in the complex output signal ($I_{OUT\_1}$, $Q_{OUT\_1}$) from the image selection filter 22-1 is frequency translated by a frequency of $f_{QMOD}$, to provide the up-converted digital signal ($S_{UP\_1}$), as illustrated in FIG. 2E. In addition, because the up-converted digital signal ($S_{UP\_1}$) is a real signal, it also includes frequency-flipped images of frequency-translated images.

Figure 2F:
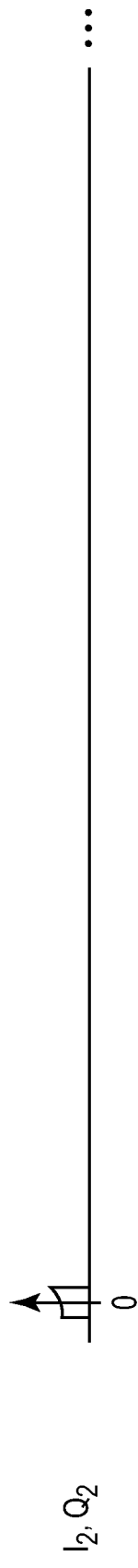
Figure 2G:
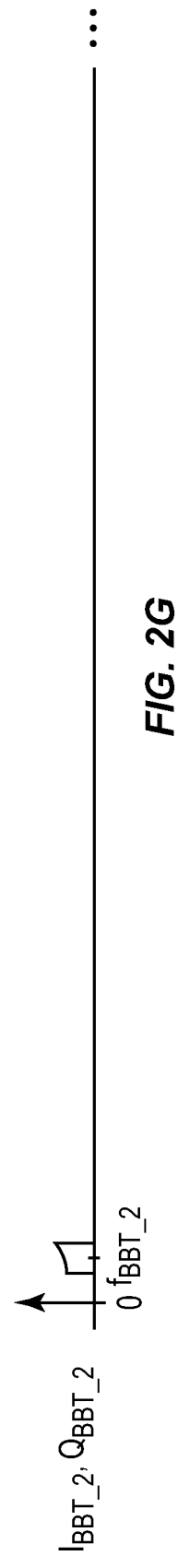
Figure 2H:
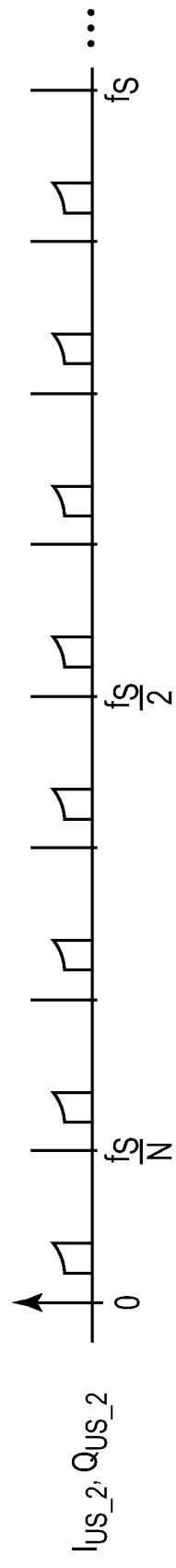
Figure 2I:
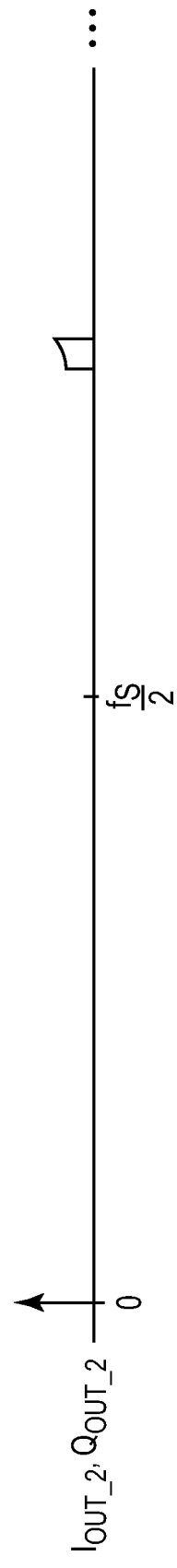
Figure 2J:
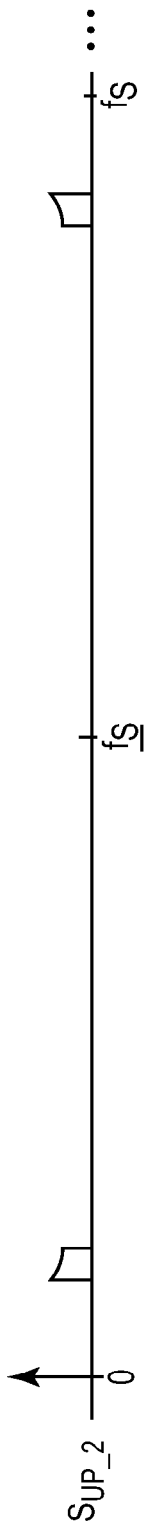

FIGS. 2F through 2J illustrate the operation of the digital up-converter chain 12-M for the Mth band of the concurrent dual-band signal where for the concurrent dual-band signal M=2. As illustrated in FIG. 2F, the complex baseband digital signal ($I_2$, $Q_2$) is centered at DC. The complex baseband tuner 18-2 tunes the complex baseband digital signal ($I_2$, $Q_2$) to the baseband tuning frequency ($f_{BBT\_2}$), as illustrated in FIG. 2G. After up-sampling by the up-sampler 20-2, the up-sampled digital signal ($I_{US\_2}$, $Q_{US\_2}$) includes N equally spaced images of the complex tuned digital signal ($I_{BBT\_2}$, $Q_{BBT\_2}$) between DC and $f_S$, wherein in this example N=8, as illustrated in FIG. 2H. The image selection filter 22-2 then filters the up-sampled digital signal ($I_{US\_2}$, $Q_{US\_2}$) to select the desired image, as illustrated in FIG. 2I. Finally, after digital quadrature modulation, the image in the complex output signal ($I_{OUT\_2}$, $Q_{OUT\_2}$) from the image selection filter 22-2 is frequency translated by a frequency of $f_{QMOD}$ to provide the up-converted digital signal ($S_{UP\_2}$), as illustrated in FIG. 2J. In addition, because the up-converted digital signal ($S_{UP\_2}$) is a real signal, it also includes frequency-flipped images of frequency-translated images.

Figure 2K:
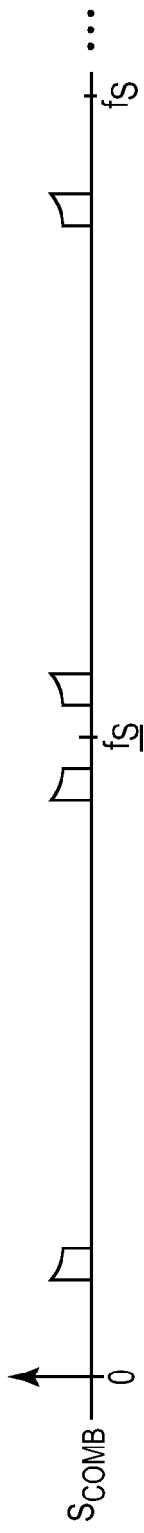
Figure 2L:
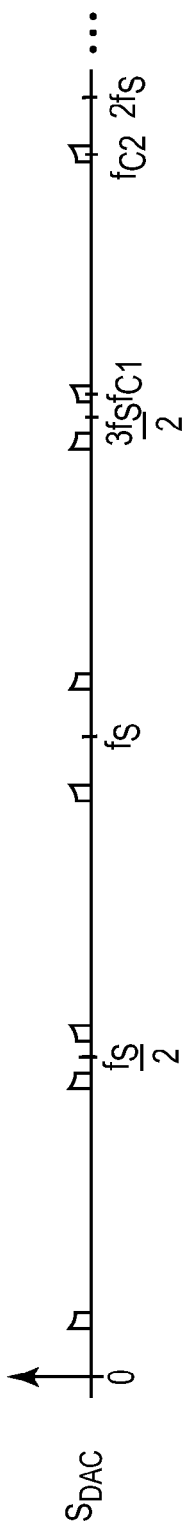
Figure 2M:
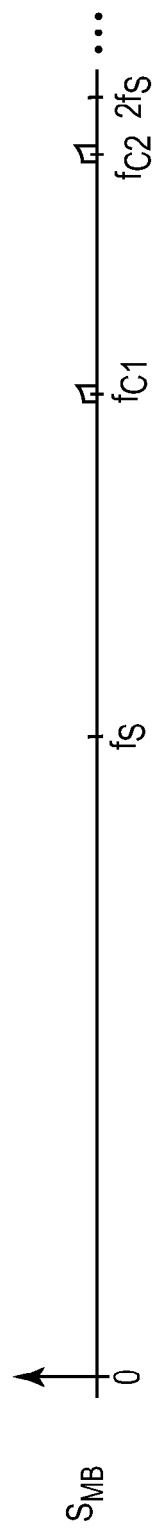

Then, as illustrated in FIG. 2K, the digital combiner 24 combines the up-converted digital signals ($S_{UP\_1}$ and $S_{UP\_2}$) to provide the combined signal ($S_{COMB}$). Next, the combined signal ($S_{COMB}$) is digital-to-analog converted by the DAC 26 to provide the analog signal ($S_{DAC}$) as illustrated in FIG. 2L. As shown, the analog signal ($S_{DAC}$) includes images of the spectrum occurring between DC and $f_S$ repeatedly in the positive frequency direction. While not shown, the images of the spectrum also occur repeatedly in the negative frequency direction. Lastly, the RF filter 28 selects images located at center frequencies ($f_{C1}$ and $f_{C2}$) of the frequency bands of the concurrent dual-band signal to thereby provide the concurrent dual-band signal, as illustrated in FIG. 2M. Thus, by using complex baseband tuning, up-sampling, image selection filtering, and quadrature modulation, images of the complex baseband digital signals ($I_1$, $Q_1$ and $I_2$, $Q_2$) are produced at the desired carrier frequencies of the concurrent dual-band signal.

Figure 3:
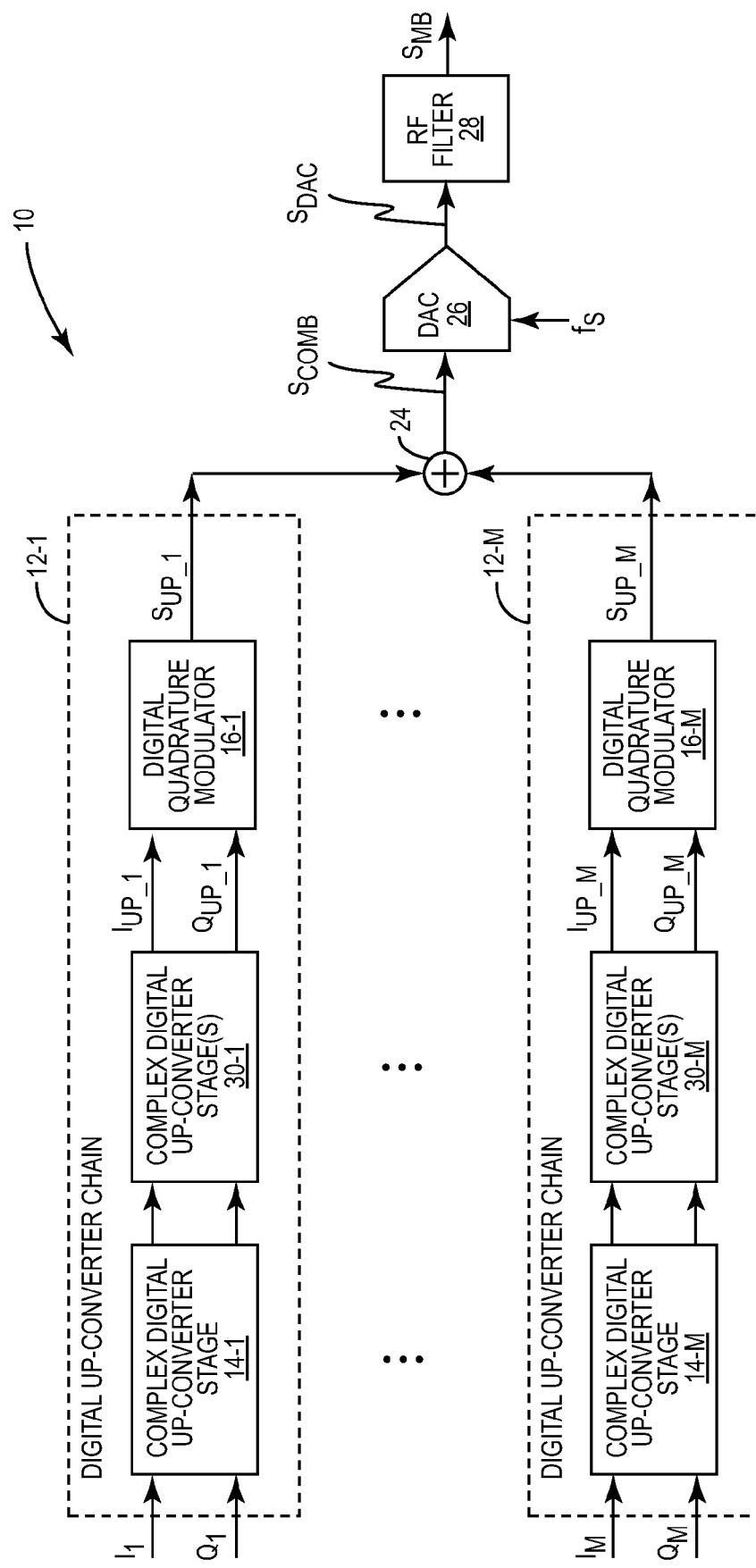
FIG. 3 illustrates a digital up-conversion for a concurrent multi-band signal that is similar to that of FIG. 1 but where each digital up-converter chain can include multiple complex digital up-converter stages according to another embodiment of the present disclosure.

FIG. 3 illustrates the digital up-conversion system 10 according to another embodiment of the present disclosure. As illustrated, the digital up-conversion system 10 is substantially the same as that of FIG. 1. However, in this embodiment, at least some of the digital up-converter chains 12-1 through 12-M include multiple complex digital up-converter stages. More specifically, in this example, the digital up-converter chain 12-1 includes the complex digital up-converter stage 14-1 as well as one or more additional complex digital up-converter stages 30-1. The additional complex digital converter stage(s) 30-1 may be implemented like the complex digital up-converter stage 14-1 of FIG. 1. However, in this embodiment, up-sampling by the desired factor of N is split between the up-samplers of the complex digital up-converter stages 14-1 and 30-1.

In one embodiment, the baseband tuning frequencies and filter tuning frequencies of the complex baseband tuners and image selection filters of the complex digital up-converter stages 14-1 and 30-1 are determined based on the effective sampling rate ($f_S$) of the DAC 26 and the collective up-sampling rate (N) of the up-samplers such that the up-converted digital signal ($S_{UP\_1}$) includes an image of the complex baseband digital signal ($I_1$, $Q_1$) at the desired up-conversion frequency for the first frequency band of the concurrent multi-band signal ($S_{MB}$). Alternatively, the filter tuning frequencies of the image selection filters of the complex digital up-converter stages 14-1 and 30-1 are predetermined, and the effective sampling rate ($f_S$) of the DAC 26 and subsequently the baseband tuning frequencies of the complex baseband tuners are configured such that, after further processing of the combined signal ($S_{COMB}$) by the DAC 26 and the RF filter 28, an image of the complex baseband digital signal ($I_1$, $Q_1$) is centered at the desired carrier frequency for the first frequency band of the concurrent multi-band signal ($S_{MB}$).

Likewise, the digital up-converter chain 12-M includes the complex digital up-converter stage 14-M as well as one or more additional complex digital up-converter stages 30-M. The additional complex digital converter stage(s) 30-M may be implemented like the complex digital up-converter stage 14-M of FIG. 1. However, in this embodiment, up-sampling by the desired factor of N is split between the up-samplers of the complex digital up-converter stages 14-M and 30-M.

In one embodiment, the baseband tuning frequencies and filter tuning frequencies of the complex baseband tuners and image selection filters of the complex digital up-converter stages 14-M and 30-M are determined based on the effective sampling rate ($f_S$) of the DAC 26 and the collective up-sampling rate (N) of the up-samplers such that the up-converted digital signal ($S_{UP\_M}$) includes an image of the complex baseband digital signal ($I_M$, $Q_M$) at the desired up-conversion frequency for the Mth frequency band of the concurrent multi-band signal ($S_{MB}$). Alternatively, the filter tuning frequencies of the image selection filters of the complex digital up-converter stages 14-M and 30-M are predetermined, and the effective sampling rate ($f_S$) of the DAC 26 and subsequently the baseband tuning frequencies of the complex bandband tuners are configured such that, after further processing of the combined signal ($S_{COMB}$) by the DAC 26 and the RF filter 28, an image of the complex baseband digital signal ($I_M$, $Q_M$) is centered at the desired carrier frequency for the corresponding frequency band of the concurrent multi-band signal ($S_{MB}$).

Figure 4:
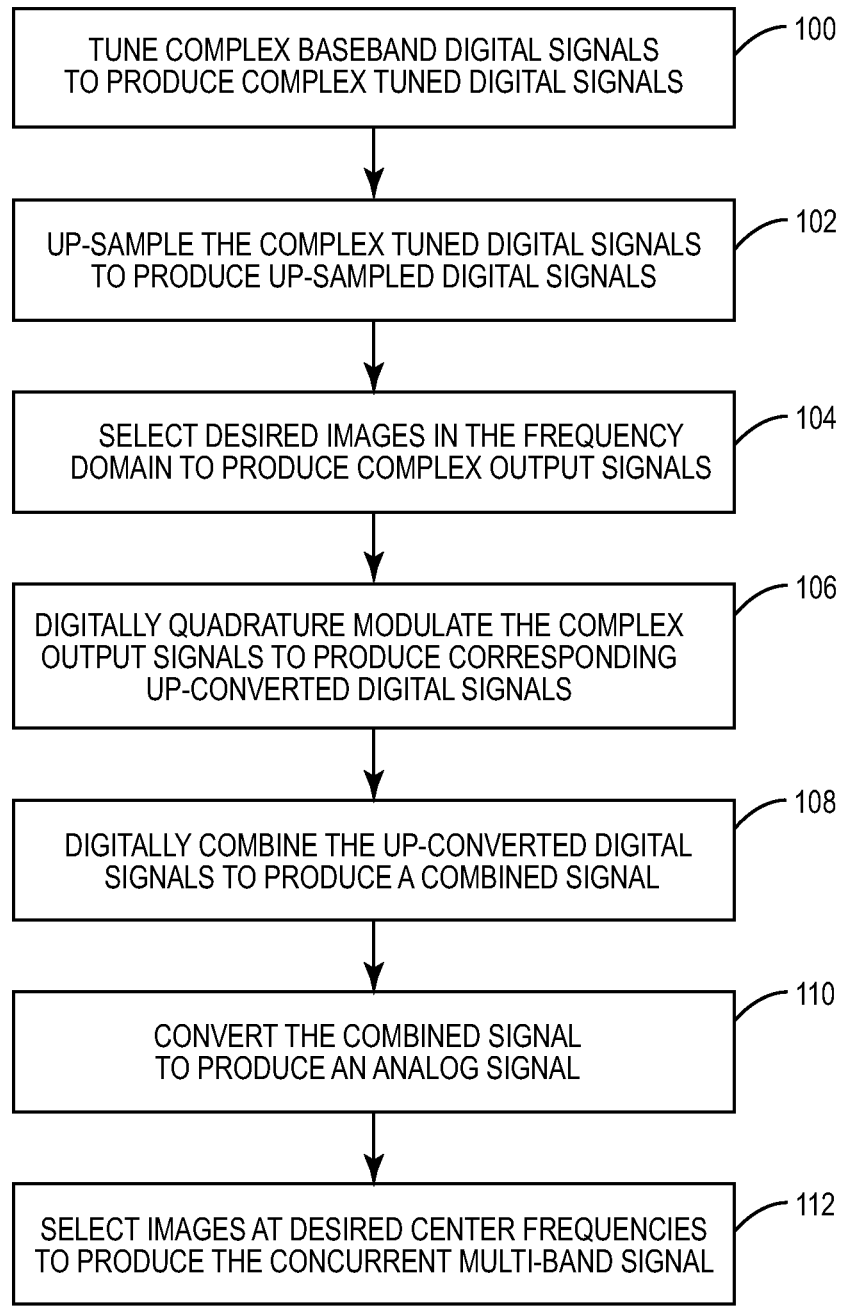
FIG. 4 is a flow chart illustrating the operation of the digital up-conversion systems of FIGS. 1 and 3 according to one embodiment of the present disclosure.

FIG. 4 is a flow chart that illustrates the operation of the digital up-conversion system 10 of FIGS. 1 and 3 according to one embodiment of the present disclosure. First, the complex baseband tuners 18-1 through 18-M complex tune the complex baseband digital signals ($I_1$, $Q_1$ through $I_M$, $Q_M$) to produce the corresponding complex tuned digital signals ($I_{BBT\_1}$, $Q_{BBT\_1}$ through $I_{BBT\_M}$, $Q_{BBT\_M}$) (step 100). Next, the up-samplers 20-1 through 20-M up-sample the complex tuned digital signals ($I_{BBT\_1}$, $Q_{BBT\_1}$ through $I_{BBT\_M}$, $Q_{BBT\_M}$) to produce the up-sampled digital signals ($I_{US\_1}$, $Q_{US\_1}$ through $I_{US\_M}$, $Q_{US\_M}$) (step 102). The image selection filters 22-1 through 22-M then select the desired images in the up-sampled digital signals ($I_{US\_1}$, $Q_{US\_1}$ through $I_{US\_M}$, $Q_{US\_M}$) to produce the complex output signals ($I_{OUT\_1}$, $Q_{OUT\_1}$ through $I_{OUT\_M}$, $Q_{OUT\_M}$) (step 104). Note that if there are additional complex digital up-converter stages 30-1 through 30-M as in the embodiment of FIG. 3, then steps 100 through 104 are repeated for each of the additional complex digital up-converter stages 30-1 through 30-M.

The digital quadrature modulators 16 then perform quadrature modulation on the complex output signals ($I_{OUT\_1}$, $Q_{OUT\_1}$ through $I_{OUT\_M}$, $Q_{OUT\_M}$) output by the complex digital up-converter stages 14-1/30-1 through 14-M/30-M to provide the up-converted digital signals ($S_{UP\_1}$ through $S_{UP\_M}$) (step 106). The digital combiner 24 then combines the up-converted digital signals ($S_{UP\_1}$ through $S_{UP\_M}$) to provide the combined signal ($S_{COMB}$) (step 108). The DAC 26 performs digital-to-analog conversion of the combined signal ($S_{COMB}$) to produce the analog signal ($S_{DAC}$) (step 110). Lastly, the analog signal ($S_{DAC}$) is filtered to provide the concurrent multi-band signal ($S_{MB}$) (step 112).

Additional method steps may also involve determining the amount of complex tuning for the complex tuning step and determining filter coefficients used in the image selection filtering step. In some embodiments, an amount of complex tuning used in the complex tuning step and filter coefficients used in the image selection filtering step are each determined as a function of a predetermined and potentially fixed effective sampling rate ($f_S$) of the DAC 26 such that the up-converted digital signals ($S_{UP\_1}$ through $S_{UP\_M}$) include images of the complex baseband digital signals ($I_1$, $Q_1$ through $I_M$, $Q_M$) centered at the desired up-conversion frequencies and, after digital-to-analog conversion and RF filtering of the combined signal ($S_{COMB}$), images of the complex baseband digital signals ($I_1$, $Q_1$ through $I_M$, $Q_M$) are located at the desired carrier frequencies of the corresponding frequency bands of the concurrent multi-band signal ($S_{MB}$).

If the sampling rate of the complex baseband digital signals ($I_1$, $Q_1$ through $I_M$, $Q_M$) is not $f_S/N$, then re-sampling may be performed at some point during the method to ensure that the signal input to the DAC 26 has an effective sample rate of $f_S$. If the sample rate of the complex baseband digital signals ($I_1$, $Q_1$ through $I_M$, $Q_M$) is not $f_S/N$, then there may not be N images in the bandwidth between DC and $f_S$ as described in the example above. Rather, N images would occur between DC and the sample rate of the complex baseband digital signals ($I_1$, $Q_1$ through $I_M$, $Q_M$) multiplied by N.

In some embodiments, up-sampling and image selection filtering are implemented together as a polyphase filtering process. In some embodiments, quadrature modulation is implemented subsequent to, and in combination with, the polyphase filtering process.

In some embodiments, the steps described above for performing up-conversion may not be implemented in the particular order described and illustrated in FIG. 4. In some embodiments, digital quadrature modulation may be implemented subsequent to the complex baseband tuning of step 100 and prior to the up-sampling of step 102.

As a result of the unique usage of complex tuning, the inherently repetitive nature of sampled signals, and programmable digital filtering, some embodiments of the method provide flexible digital up-conversion capable of tunability over a wide frequency range. Having such a wide frequency range of tunability, the method may be used for effectively re-banding a radio from one set of concurrent frequency bands to another set of concurrent frequency bands in a manner that is not possible with conventional analog radios. Whereas conventional analog radios would typically need to be redesigned for different sets of concurrent frequency bands, a radio implementing some embodiments of the digital up-conversion system 10 disclosed herein can be easily reconfigured by providing the radio with information to change the operating parameters of one or more programmable components such that when the operating parameters are implemented the radio operates in the new set of frequency bands. The method may be used to reconfigure a radio which has been operating to provide a concurrent multi-band signal using one set of frequency bands to operate to provide a concurrent multi-band signal using a different set of frequency bands without significant redesign of the components performing the up-conversion function.

Figure 5:
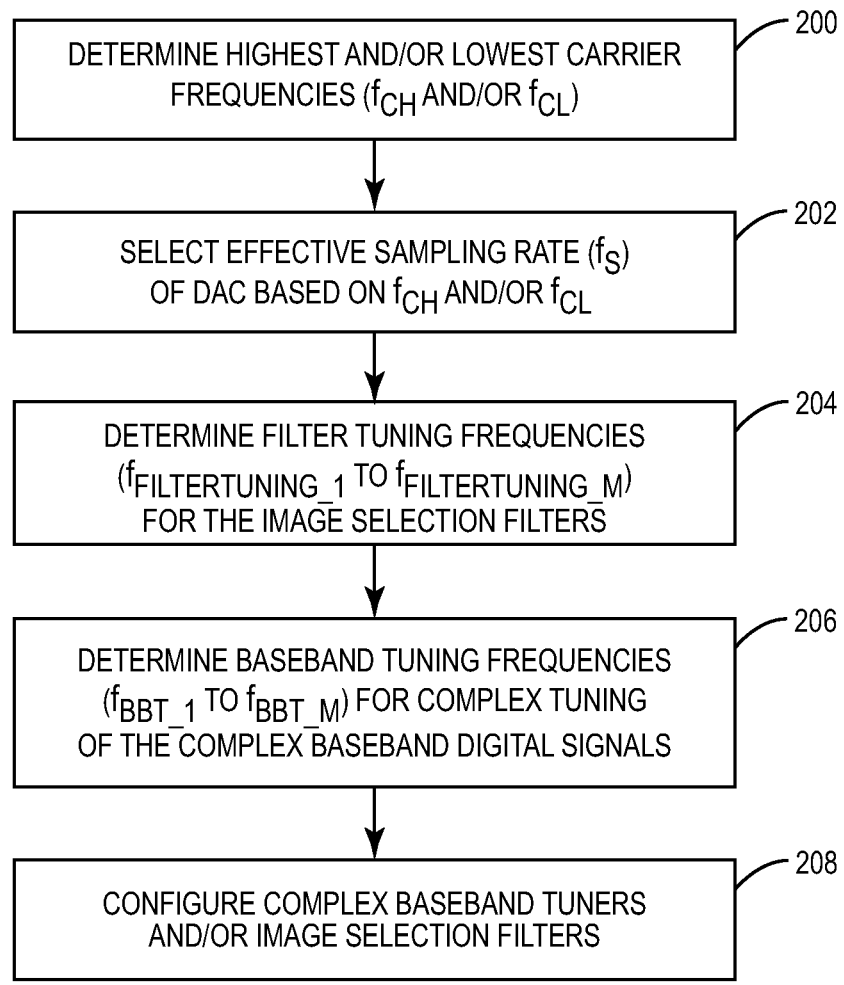
FIG. 5 is a flow chart that illustrates a process for configuring the digital up-conversion systems of FIGS. 1 and 3 according to one embodiment of the present disclosure.

FIG. 5 illustrates a process for configuring the digital up-conversion system 10 according to one embodiment of the present disclosure. In this particular embodiment, the digital up-converter chains 12-1 through 12-M of the digital up-conversion system 10 are those of FIG. 1. However, this process may be extended to configure the digital up-converter chains 12-1 through 12-M having multiple complex digital up-converter stages as shown in FIG. 3. First, a highest carrier frequency ($f_{CH}$) and/or a lowest carrier frequency ($f_{CL}$) of the carrier frequencies of the concurrent multi-band signal are determined (step 200). Next, the effective sampling rate ($f_S$) of the DAC 26 is selected based on the highest carrier frequency ($f_{CH}$) and/or the lowest carrier frequency ($f_{CL}$) of the carrier frequencies of the concurrent multi-band signal (step 202). More specifically, in one embodiment, the effective sampling rate ($f_S$) is selected such that $f_S/2 < f_{CL}$. In another embodiment, the effective sampling rate ($f_S$) is selected such that $f_{CH} < f_S$. Note that while in this embodiment the highest carrier frequency ($f_{CH}$) and/or the lowest carrier frequency ($f_{CL}$) of the carrier frequencies of the concurrent multi-band signal are determined prior to selecting the effective sampling rate ($f_S$) of the DAC 26, the present disclosure is not limited thereto. In another embodiment, the effective sampling rate ($f_S$) of the DAC 26 is selected first. Then, carrier frequencies that are suitable for the digital up-conversion system 10 are determined based on the selected effective sampling rate ($f_S$) of the DAC 26.

Next, the filter tuning frequencies ($f_{FILTERTUNING\_1}$ through $f_{FILTERTUNING\_M}$) are determined for the image selection filters 22-1 through 22-M based on the effective sampling rate ($f_S$) of the DAC 26 (step 204). In one embodiment, step 202 is performed such that the effective sampling rate ($f_S$) of the DAC 26 is predetermined and fixed. In another embodiment, the effective sampling rate ($f_S$) of the DAC 26 is configurable. The filter tuning frequencies ($f_{FILTERTUNING\_1}$ through $f_{FILTERTUNING\_M}$) are such that the images of the complex baseband digital signals ($I_1, Q_1$ through $I_M, Q_M$), and more specifically the complex baseband digital signals ($I_1, Q_1$ through $I_M, Q_M$), produced at the desired up-conversion frequencies for the up-converted digital signals ($S_{UP\_1}$ through $S_{UP\_M}$) are selected or, in other words, passed by the image selection filters 22-1 through 22-M while the remaining images are attenuated, or removed.

Lastly, the baseband tuning frequencies ($f_{BBT\_1}$ through $f_{BBT\_M}$) of the complex baseband tuners 18-1 through 18-M are determined based on the effective sampling rate ($f_S$) of the DAC 26 (step 206). Again, in one embodiment, step 202 is performed such that the effective sampling rate ($f_S$) of the DAC 26 is predetermined and fixed. In another embodiment, the effective sampling rate ($f_S$) of the DAC 26 is configurable. In general, the baseband tuning frequencies ($f_{BBT\_1}$ through $f_{BBT\_M}$) are select frequencies in the range of $-f_S/2N$ to $f_S/2N$ such that images of the complex baseband digital signals ($I_1, Q_1$ through $I_M, Q_M$) and more specifically images of the complex tuned digital signals ($I_{BBT\_1}, Q_{BBT\_1}$ through $I_{BBT\_M}, Q_{BBT\_M}$) are produced at the desired up-conversion frequencies for the up-converted digital signals ($S_{UP\_1}$ through $S_{UP\_M}$). The desired up-conversion frequencies for the up-converted digital signals ($S_{UP\_1}$ through $S_{UP\_M}$) are such that, after digital-to-analog conversion and RF filtering, images of the complex baseband digital signals ($I_1, Q_1$ through $I_M, Q_M$) are located at the carrier frequencies of the corresponding frequency bands of the concurrent multi-band signal ($S_{MB}$).

In one particular embodiment, for each frequency band X of the concurrent multi-band signal ($S_{MB}$), the baseband tuning frequency ($f_{BBT\_X}$) and the filter tuning frequency ($f_{FILTERTUNING\_X}$) are determined as:

$$\text{if } (f_{target\_X} - f_{qmod} \geq 0) \qquad \text{Eq. 1}$$
$$f_{filtertuning\_X} = \mod(f_{target\_X} - f_{qmod}, f_S)$$

$$\text{if } (f_{filtertuning\_X} \geq 0) \qquad \text{Eq. 2}$$
$$f_{BBT\_X} = \mod\left(f_{filtertuning\_X}, \frac{f_S}{N}\right)$$

$$\text{if } (f_{target\_X} - f_{qmod} < 0) \qquad \text{Eq. 3}$$
$$f_{filtertuning\_X} = (\mod(f_{target\_X} - f_{qmod} + f_S, f_S)) - f_S$$

$$\text{if } (f_{filtertuning\_X} < 0) \qquad \text{Eq. 4}$$
$$f_{BBT\_X} = \left(\mod\left(f_{filtertuning\_X} + \frac{f_S}{N}, \frac{f_S}{N}\right) - \frac{f_S}{N}\right)$$

where $f_{target\_X}$ is the desired center frequency of the frequency band X of the concurrent multi-band signal ($S_{MB}$), $f_S$ is a predetermined and preferably fixed effective sampling rate of the DAC 26, and N is the up-sampling rate of the up-sampler 20-X. Practically, the complex baseband tuners 18-1 through 18-M are implemented to tune over a range of $-f_S/2N$ to $f_S/2N$. If the result of Eq. 2 or Eq. 4 is greater than the absolute value of $f_S/2N$, it can be converted to the range above by subtracting $f_S/N$.

Once the baseband tuning frequencies ($f_{BBT\_1}$ through $f_{BBT\_M}$) and the filter tuning frequencies ($f_{FILTERTUNING\_1}$ through $f_{FILTERTUNING\_M}$) are determined, the complex baseband tuners 18-1 through 18-M and the image selection filters 22-1 through 22-M are configured accordingly (step 208). The image selection filters 22-1 through 22-M may be configured by, for example, providing corresponding filter coefficients to the image selection filters 22-1 through 22-M. The process of FIG. 5 can be used perform a one-time configuration (e.g., during manufacturing). However, the process of FIG. 5 is preferably used to dynamically re-configure the digital up-conversion system 10 to accommodate different concurrent multi-band signals (i.e., concurrent multi-band signals having different frequency bands).

Figure 6:
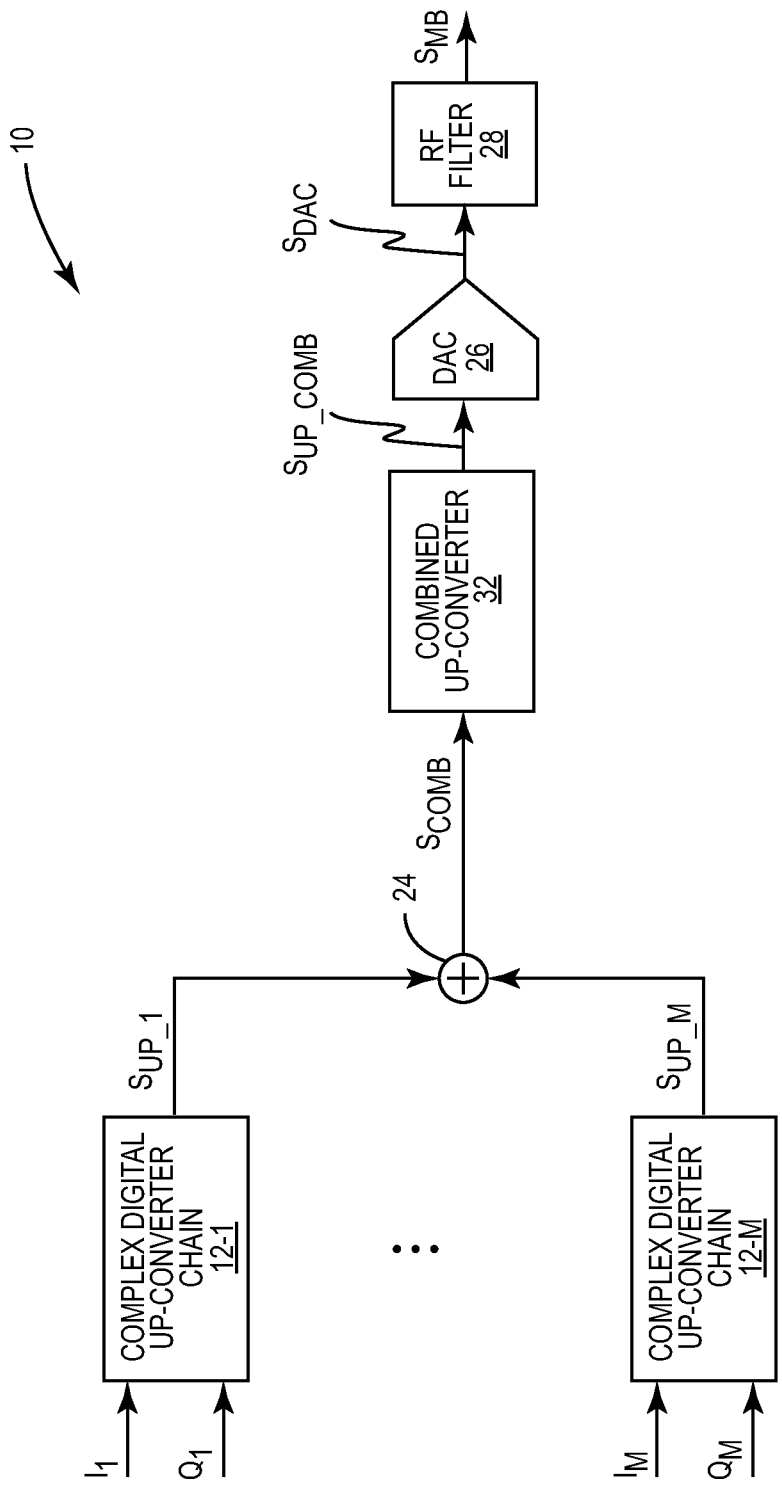
FIG. 6 illustrates a digital up-conversion for a concurrent multi-band signal that is similar to that of FIGS. 1 and 3 but where an additional combined up-converter performs further up-conversion of the combined signal according to another embodiment of the present disclosure.

FIG. 6 illustrates the digital up-conversion system 10 according to another embodiment of the present disclosure. In this embodiment, the digital up-conversion system 10 further includes a combined up-converter 32 that operates to provide additional up-conversion by a frequency ($f_{COMB}$) subsequent to the combining of the up-converted digital signals ($S_{UP\_1}$ through $S_{UP\_M}$). In this embodiment, the up-conversion frequencies of the digital up-converter chains 12 are intermediate frequencies that provide sufficient frequency separation, and the combined up-converter 32 up-converts the combined signal ($S_{COMB}$) to produce an up-converted combined signal ($S_{UP\_COMB}$).

FIGS. 7 through 11 illustrate embodiments that are similar to those of FIGS. 1 through 6. However, in the embodiments of FIGS. 7 through 11, digital quadrature modulation is performed subsequent to, rather than prior to, digitally combining the up-converted digital signals output by the digital up-converter chains 12-1 through 12-M. More specifically, FIG. 7 illustrates a programmable concurrent multi-band digital up-conversion system 10 according to another embodiment of the present disclosure. This embodiment is substantially the same as that of FIG. 1. However, in this embodiment, the digital up-converter chains 12 do not include the digital quadrature modulators 16. Instead, the digital up-conversion system 10 includes a digital quadrature modulator 34 that performs digital quadrature modulation after digitally combining complex outputs of the digital up-converter chains 12.

More specifically, as discussed above, the digital up-conversion system 10 includes the M digital up-converter chains 12-1 through 12-M, where again M is the number of frequency bands in the concurrent multi-band signal ($S_{MB}$). Each of the digital up-converter chains 12-1 through 12-M performs digital up-conversion for a different one of the frequency bands of the concurrent multi-band signal ($S_{MB}$). In this embodiment, the digital up-converter chain 12-1 digitally up-converts the complex baseband digital signal ($I_1, Q_1$) for a first frequency band of the concurrent multi-band signal ($S_{MB}$) to provide a corresponding complex up-converted digital signal ($I_{UP\_1}, Q_{UP\_1}$). Likewise, the digital up-converter chain 12-M digitally up-converts the complex baseband digital signal ($I_M, Q_M$) for an Mth frequency band of the concurrent multi-band signal ($S_{MB}$) to provide a corresponding complex up-converted digital signal ($I_{UP\_M}, Q_{UP\_M}$).

The digital up-converter chains 12-1 through 12-M include the complex digital up-converter stages 14-1 through 14-M, respectively. In this embodiment, each of the digital up-converter chains 12 includes one complex digital up-converter stage 14. However, as discussed below, one or more or even all of the digital up-converter chains 12 may also include one or more additional complex digital up-converter stages. As illustrated, the complex digital up-converter stages 14-1 through 14-M include the complex baseband tuners 18-1 through 18-M, the up-samplers 20-1 through 20-M, and the image selection filters 22-1 through 22-M, respectively, as discussed above. However, unlike the embodiment of FIG. 1, the digital up-converter chains 12-1 through 12-M do not include the digital quadrature modulators 16-1 through 16-M. In this embodiment, the complex output signals output by the image selection filters 22-1 through 22-M are referred to as complex up-converted digital signals ($I_{UP\_1}, Q_{UP\_1}$ through $I_{UP\_M}, Q_{UP\_M}$) output by the digital up-converter chains 12-1 through 12-M.

The complex up-converted digital signals ($I_{UP\_1}, Q_{UP\_1}$ through $I_{UP\_M}, Q_{UP\_M}$) are combined by a complex digital combiner 36 to provide a complex combined signal ($I_{COMB}, Q_{COMB}$). More specifically, the complex digital combiner 36 includes a first digital combiner 38 that combines, or sums, in-phase components ($I_{UP\_1}$ through $I_{UP\_M}$) of the complex up-converted digital signals ($I_{UP\_1}, Q_{UP\_1}$ through $I_{UP\_M}$, $Q_{UP\_M}$) to provide an in-phase component ($I_{COMB}$) of the complex combined signal ($I_{COMB}, Q_{COMB}$). The complex digital combiner 36 also includes a second digital combiner 40 that combines, or sums, quadrature-phase components ($Q_{UP\_1}$ through $Q_{UP\_M}$) of the complex up-converted digital signals ($I_{UP\_1}, Q_{UP\_1}$ through $I_{UP\_M}, Q_{UP\_M}$) to provide a quadrature-phase component ($Q_{COMB}$) of the complex combined signal ($I_{COMB}, Q_{COMB}$).

The digital quadrature modulator 34 then performs quadrature modulation on the complex combined signal ($I_{COMB}, Q_{COMB}$) to provide a quadrature modulated signal ($S_{QMOD}$). In the frequency domain, quadrature modulation results in frequency translating, or frequency-shifting, the desired images of the complex tuned digital signals ($I_{BBT\_1}, Q_{BBT\_1}$ through $I_{BBT\_M}, Q_{BBT\_M}$) in the combined complex signal ($I_{COMB}, Q_{COMB}$) by $f_{QMOD}$, where $f_{QMOD}$ is a modulation frequency of the digital quadrature modulator 34, and converting the complex signal into a real signal. Again, $f_{QMOD}$ can be any desired frequency including zero. Because the quadrature modulated signal ($S_{QMOD}$) is a real signal, the quadrature modulated signal ($S_{QMOD}$) includes both the frequency-translated images of the complex tuned digital signals ($I_{BBT\_1}, Q_{BBT\_1}$ through $I_{BBT\_M}, Q_{BBT\_M}$) from the complex combined signal ($I_{COMB}, Q_{COMB}$) and frequency-flipped images of the frequency-translated images. Before proceeding, it should be noted that, in an alternative embodiment, the quadrature modulator 34 may be an analog quadrature modulator that follows the DAC 26 and is prior to the RF filter 28, in which case there would be two DACs 26, namely, one DAC 26 for I and another DAC 26 for Q.

The DAC 26 receives the quadrature modulated signal ($S_{QMOD}$) from the digital quadrature modulator 34 and converts it to the analog signal ($S_{DAC}$). When considering the frequency domain, digital-to-analog conversion by the DAC 26 also generates images of the spectrum occurring between DC and $f_S$ repeatedly in the positive and negative frequency directions. More specifically, the spectrum of DC to $f_S$ is repeated in the positive direction between $f_S$ and $2f_S$, $2f_S$ and $3f_S$, etc. and in the negative frequency direction between 0 and $-f_S$, $-f_S$ and $-2f_S$, $-2f_S$ and $-3f_S$, etc.

The RF filter 28 filters the analog signal ($S_{DAC}$) from the DAC 26 to provide the concurrent multi-band signal ($S_{MB}$). More specifically, the RF filter 28 passes the images of the complex tuned digital signals ($I_{BBT\_1}, Q_{BBT\_1}$ through $I_{BBT\_M}, Q_{BBT\_M}$) in the digital-to-analog converted quadrature modulated signal ($S_{MOD}$) centered at the desired carrier frequencies of the frequency bands of the concurrent multi-band signal ($S_{MB}$) while attenuating, or removing, the remaining undesired images and frequency-flipped images of the complex tuned digital signals ($I_{BBT\_1}, Q_{BBT\_1}$ through $I_{BBT\_M}, Q_{BBT\_M}$). For each frequency band of the concurrent multi-band signal ($S_{MB}$), the desired image may be below the sampling rate $f_S$ of the DAC 26 (e.g., in the first or second Nyquist zones) or above the sampling rate $f_S$ (e.g., in the third or higher Nyquist zone).

Figure 8A:
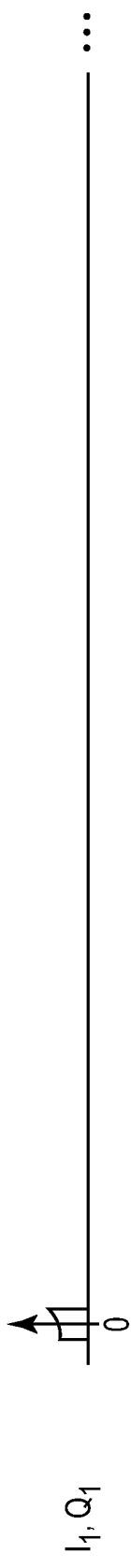
Figure 8B:
Figure 8C:
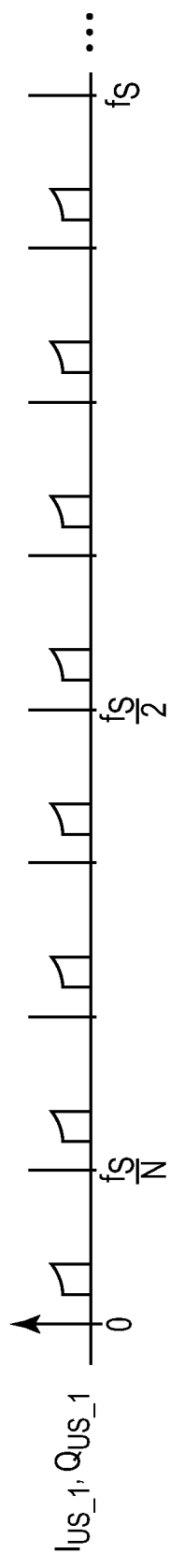
Figure 8D:
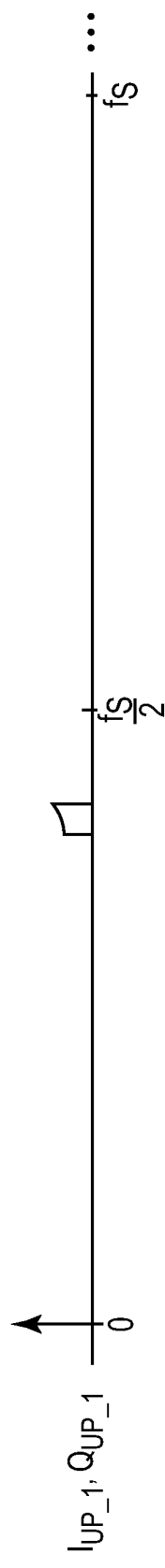

FIGS. 8A through 8L are frequency-domain diagrams that graphically illustrate the operation of the digital up-conversion system 10 for one example where the concurrent multi-band signal ($S_{MB}$) is a concurrent dual-band signal. FIGS. 8A through 8D illustrate the operation of the digital up-converter chain 12-1 for the first band of the concurrent dual-band signal. As illustrated in FIG. 8A, the complex baseband digital signal ($I_1, Q_1$) is centered at DC. The complex baseband tuner 18-1 tunes the complex baseband digital signal ($I_1, Q_1$) to the baseband tuning frequency ($f_{BBT\_1}$), as illustrated in FIG. 8B. After up-sampling by the up-sampler 20-1, the up-sampled digital signal ($I_{US\_1}, Q_{US\_1}$) includes N equally spaced images of the complex tuned digital signal ($I_{BBT\_1}$, $Q_{BBT\_1}$) between DC and $f_S$, wherein in this example N=8, as illustrated in FIG. 8C. The image selection filter 22-1 then filters the up-sampled digital signal ($I_{US\_1}$, $Q_{US\_1}$) to select the desired image and thereby provide the complex up-converted digital signal ($I_{UP\_1}$, $Q_{UP\_1}$), as illustrated in FIG. 8D.

FIGS. 8E through 8H illustrate the operation of the digital up-converter chain 12-M for the Mth band of the concurrent dual-band signal where for the concurrent dual-band signal M=2. As illustrated in FIG. 8E, the complex baseband digital signal ($I_2$, $Q_2$) is centered at DC. The complex baseband tuner 18-2 tunes the complex baseband digital signal ($I_2$, $Q_2$) to the baseband tuning frequency ($f_{BBT\_2}$), as illustrated in FIG. 8F. After up-sampling by the up-sampler 20-2, the up-sampled digital signal ($I_{US\_2}$, $Q_{US\_2}$) includes N equally spaced images of the complex tuned digital signal ($I_{BBT\_2}$, $Q_{BBT\_2}$) between DC and $f_S$, wherein in this example N=8, as illustrated in FIG. 8G. The image selection filter 22-2 then filters the up-sampled digital signal ($I_{US\_2}$, $Q_{US\_2}$) to select the desired image and thereby provide the complex up-converted digital signal ($I_{UP\_2}$, $Q_{UP\_2}$), as illustrated in FIG. 8H.

Then, as illustrated in FIG. 8I, the complex digital combiner 36 combines the up-converted complex digital signals ($I_{UP\_1}$, $Q_{UP\_1}$ and $I_{UP\_2}$, $Q_{UP\_2}$) to provide the complex combined signal ($I_{COMB}$, $Q_{COMB}$). The complex combined signal ($I_{COMB}$, $Q_{COMB}$) is quadrature modulated by the digital quadrature modulator 34 to provide the quadrature modulated signal ($S_{QMOD}$), as illustrated in FIG. 8J. As shown in FIG. 8J, as a result of the quadrature modulation, the images in the complex combined signal ($I_{COMB}$, $Q_{COMB}$) are frequency translated by a frequency $f_{QMOD}$. In addition, because the quadrature modulated signal ($S_{QMOD}$) is a real signal, it also includes frequency-flipped images of frequency-translated images.

Next, the quadrature modulated signal ($S_{QMOD}$) is digital-to-analog converted by the DAC 26 to provide the analog signal ($S_{DAC}$) as illustrated in FIG. 8K. As shown, the analog signal ($S_{DAC}$) includes images of the spectrum occurring between DC and $f_S$ repeatedly in the positive frequency direction. While not shown, the images of the spectrum also occur repeatedly in the negative frequency direction. Lastly, the RF filter 28 selects images located at carrier frequencies ($f_{C1}$ and $f_{C2}$) of the frequency bands of the concurrent dual-band signal to thereby provide the concurrent dual-band signal, as illustrated in FIG. 8L. The RF filter 28 can be either a multi-band filter or a wide-band filter. Multi-Nyquist zone operation is possible if the RF filter 28 passes the desired signal in different Nyquist zones. Thus, in order to allow filtering, the image from one Nyquist zone should not land on or near the desired signal in another Nyquist zone. For example, if it is desired to transmit 728-746 MHz simultaneously with 2110-2170 MHz, then $f_S$=2877 MHz does not work because the images land on each other, but $f_S$=2500 MHz does work as the images are 330-390 MHz and 1745-1781 MHz which are both away from the desired frequencies. By using complex baseband tuning, up-sampling, image selection filtering, and quadrature modulation, images of the complex baseband digital signals ($I_1$, $Q_1$ and $I_2$, $Q_2$) are produced at the desired carrier frequencies of the concurrent dual-band signal.

FIG. 9 illustrates the digital up-conversion system 10 according to another embodiment of the present disclosure. As illustrated, the digital up-conversion system 10 is substantially the same as that of FIG. 7. However, in this embodiment, at least some of the digital up-converter chains 12-1 through 12-M include multiple complex digital up-converter stages 30-1 through 30-M, as described above with respect to FIG. 3.

FIG. 10 is a flow chart that illustrates the operation of the digital up-conversion system 10 of FIGS. 7 and 9 according to one embodiment of the present disclosure. This embodiment is substantially the same as that of FIG. 4 but where digital quadrature modulation has been moved after digitally combining the up-converted signals output by the digital up-converter chains 12-1 through 12-M. First, the complex baseband tuners 18-1 through 18-M tune the complex baseband digital signals ($I_1$, $Q_1$ through $I_M$, $Q_M$) to produce the corresponding complex tuned digital signals ($I_{BBT\_1}$, $Q_{BBT\_1}$ through $I_{BBT\_M}$, $Q_{BBT\_M}$) (step 300). Next, the up-samplers 20-1 through 20-M up-sample the complex tuned digital signals ($I_{BBT\_1}$, $Q_{BBT\_1}$ through $I_{BBT\_M}$, $Q_{BBT\_M}$) to produce the up-sampled digital signals ($I_{US\_1}$, $Q_{US\_1}$ through $I_{US\_M}$, $Q_{US\_M}$) (step 302). The image selection filters 22-1 through 22-M then select the desired images in the up-sampled digital signals ($I_{US\_1}$, $Q_{US\_1}$ through $I_{US\_M}$, $Q_{US\_M}$) to thereby provide the complex up-converted digital signals ($I_{UP\_1}$, $Q_{UP\_1}$ through $I_{UP\_M}$, $Q_{UP\_M}$) (step 304). Note that if there are additional complex digital up-converter stages 30-1 through 30-M as in the embodiment of FIG. 9, then steps 400 through 404 are repeated for each of the additional complex digital up-converter stages 30-1 through 30-M.

The complex digital combiner 36 then combines the complex up-converted digital signals ($I_{UP\_1}$, $Q_{UP\_1}$ through $I_{UP\_M}$, $Q_{UP\_M}$) to provide the complex combined signal ($I_{COMB}$, $Q_{COMB}$) (step 306). The complex combined signal ($I_{COMB}$, $Q_{COMB}$) is quadrature modulated to provide the quadrature modulated signal ($S_{QMOD}$) (step 308). The DAC 26 performs digital-to-analog conversion of the quadrature modulated signal ($S_{QMOD}$) to produce the analog signal ($S_{DAC}$) (step 310). Lastly, the analog signal ($S_{DAC}$) is filtered to provide the concurrent multi-band signal ($S_{MB}$) (step 312).

Notably, in one embodiment, the digital up-converter chains 12-1 through 12-M in the embodiments of FIGS. 7 and 9 are configured based on a fixed or predetermined effective sampling rate ($f_S$) of the DAC 26 using the process of FIG. 5 in order to provide the concurrent multi-band signal ($S_{MB}$) with the desired carrier frequencies. In another embodiment, the effective sampling rate ($f_S$) of the DAC 26 is configured based on predetermined parameters (e.g., complex tuning frequencies of the complex baseband tuners 18 and/or tuning frequencies of the image selection filters 22) in order to provide the concurrent multi-band signal ($S_{MB}$) with the desired carrier frequencies.

FIG. 11 illustrates the digital up-conversion system 10 according to another embodiment of the present disclosure. In this embodiment, the digital up-conversion system 10 is a variation of the embodiments of FIGS. 7 and 9 wherein the digital up-conversion system 10 further includes the combined up-converter 32 as discussed above with respect to FIG. 6. The combined up-converter 32 operates to provide additional up-conversion by a frequency ($f_{COMB}$) subsequent to the combining of the complex up-converted digital signals ($I_{UP\_1}$, $Q_{UP\_1}$ through $I_{UP\_M}$, $Q_{UP\_M}$). In this example, the combined up-converter 32 is subsequent to the digital quadrature modulator 34. However, the combined up-converter 32 may alternatively be prior to the digital quadrature modulator 34 and subsequent to the complex digital combiner 36. Note, however, that the combined up-converter 32 is "real" if after digital quadrature modulation but "complex" if before digital quadrature modulation.

The following acronyms are used throughout this disclosure.

3GPP 3$^{rd}$ Generation Partnership Project
ASIC Application Specific Integrated Circuit
CDMA Code Division Multiple Access DAC Digital-to-Analog Converter
FPGA Field Programmable Gate Array
GHz Gigahertz
MHz Megahertz
RF Radio Frequency Those skilled in the art will recognize improvements and modifications to the preferred embodiments of the present disclosure. All such improvements and modifications are considered within the scope of the concepts disclosed herein and the claims that follow.

What is claimed is:

1. A digital up-conversion system for a concurrent multi-band signal, comprising:
    a plurality of digital up-converter chains configured to provide digital up-conversion for different ones of a plurality of frequency bands of a concurrent multi-band signal, where each digital up-converter chain of the plurality of digital up-converter chains comprises:
        one or more complex digital up-converter stages each comprising a complex baseband tuner followed by an up-sampler and an image selection filter, the one or more complex digital up-converter stages configured to:
            receive a complex baseband digital signal for a corresponding one of the plurality of frequency bands of the concurrent multi-band signal; and
            process the complex baseband digital signal to provide a complex output signal that comprises an image of the complex baseband digital signal centered at a desired output frequency for the one or more complex digital up-converter stages; and
        a digital quadrature modulator configured to perform digital quadrature modulation of the complex output signal to provide a digital up-converted signal output by the digital up-converter chain where the digital up-converted signal comprises the image of the complex baseband digital signal at a desired up-conversion frequency for the digital up-converter chain;
    a digital combiner configured to digitally combine a plurality of up-converted digital signals output from the plurality of digital up-converter chains to provide a combined digital signal; and
    one or more additional processing components configured to process the combined digital signal to provide the concurrent multi-band signal, the one or more additional processing components comprising a combined up-converter that provides additional up-conversion, a digital-to-analog converter, and a multi-passband radio frequency filter that follows the digital-to-analog converter.

2. The digital up-conversion system of claim 1 wherein one or more configurable parameters of each digital up-converter chain of the plurality of digital up-converter chains is selected based on a predetermined effective sampling rate of the digital-to-analog converter and a carrier frequency of a corresponding one of the plurality of frequency bands of the concurrent multi-band signal.

3. The digital up-conversion system of claim 1 wherein one or more configurable parameters of the one or more additional processing components are selected based on predetermined configuration parameters for the plurality of digital up-converter chains and center frequencies of the plurality of frequency bands of the concurrent multi-band signal.

4. The digital up-conversion system of claim 1 wherein an effective sampling rate of the digital-to-analog converter is selected based on predetermined configuration parameters for the plurality of digital up-converter chains and center frequencies of the plurality of frequency bands of the concurrent multi-band signal.

5. The digital up-conversion system of claim 1 wherein the digital-to-analog converter is configured to operate at an effective sampling rate that is sufficient to at least be able to convert the concurrent multi-band signal plus a separation bandwidth between a first frequency band of the plurality of frequency bands and a last frequency band of the plurality of frequency bands.

6. The digital up-conversion system of claim 1 wherein, for each digital up-converter chain of the plurality of digital up-converter chains, the desired up-conversion frequency for the digital up-converter chain is such that, after processing of the combined digital signal by the one or more additional processing components, the image of the complex baseband digital signal for the corresponding one of the plurality of frequency bands of the concurrent multi-band signal is centered at a desired carrier frequency for the corresponding one of the plurality of frequency bands of the concurrent multi-band signal.

7. The digital up-conversion system of claim 1 wherein a baseband tuning frequency of the complex baseband tuner and a tuning frequency of the image selection filter of at least one of the one or more complex digital up-converter stages are configurable.

8. The digital up-conversion system of claim 1 wherein an effective sampling rate of the digital-to-analog converter is configurable.

9. The digital up-conversion system of claim 1 wherein the one or more additional processing components comprise the digital-to-analog converter followed by a radio frequency filter.

10. The digital up-conversion system of claim 1 wherein each digital up-converter chain of the plurality of digital up-converter chains comprises a coarse tuning mechanism and a fine tuning mechanism that together provide tuning to achieve a desired carrier frequency for a corresponding one of the plurality of frequency bands of the concurrent multi-band signal.

11. The digital up-conversion system of claim 2 wherein the predetermined effective sampling rate of the digital-to-analog converter is fixed.

12. The digital up-conversion system of claim 7 wherein the baseband tuning frequency of the complex baseband tuner and the tuning frequency of the image selection filter of the at least one of the one or more complex digital up-converter stages are selected based on an effective sampling rate of the digital-to-analog converter such that, after processing of the combined digital signal by the one or more additional processing components, the image of the complex baseband digital signal is centered at a desired carrier frequency of the corresponding one of the plurality of frequency bands of the concurrent multi-band signal.

13. The digital up-conversion system of claim 8 wherein the effective sampling rate of the digital-to-analog converter is selected based on a tuning frequency of the image selection filter of each of the one or more complex digital up-converter stages of the plurality of digital up-converter chains and subsequently a baseband tuning frequency of the complex baseband tuner of each of the one or more complex digital up-converter stages of the plurality of digital up-converter chains is selected such that, after processing of the combined digital signal by the one or more additional processing components, images of the complex baseband digital signals up-converted by the plurality of digital up-converter chains are centered at desired carrier frequencies of corresponding ones of the plurality of frequency bands of the concurrent multi-band signal.

14. A method of operation of a digital up-conversion system for a concurrent multi-band signal comprising a plurality of digital up-converter chains configured to provide digital up-conversion for different ones of a plurality of frequency bands of the concurrent multi-band signal, comprising:
   for each frequency band of the plurality of frequency bands of the concurrent multi-band signal, digitally up-converting a complex baseband digital signal for the frequency band via a corresponding one of the plurality of digital up-converter chains to thereby provide an up-converted digital signal for the frequency band by:
      receiving the complex baseband digital signal for the frequency band;
      processing the complex baseband digital signal to provide a complex output signal that comprises an image of the complex baseband digital signal centered at a desired output frequency; and
      performing digital quadrature modulation of the complex output signal to provide the up-converted signal output by the digital up-converter chain where the up-converted signal comprises the image of the complex baseband digital signal at a desired up-conversion frequency for the digital up-converter chain;
   digitally combining the up-converted digital signals for the plurality of frequency bands of the concurrent multi-band signal to provide a combined digital signal; and
   processing the combined digital signal, including combined up-conversion that provides additional up-conversion, digital-to-analog conversion, and multi-passband radio frequency filtration that follows the digital-to-analog conversion, to provide the concurrent multi-band signal.

15. The method of claim 14 further comprising configuring one or more configurable parameters of each digital up-converter chain of the plurality of digital up-converter chains based on a predetermined effective sampling rate of the digital-to-analog conversion.

16. The method of claim 14 further comprising configuring one or more configurable parameters for processing the combined digital signal based on predetermined configuration parameters for the plurality of digital up-converter chains and center frequencies of the plurality of frequency bands of the concurrent multi-band signal.

17. The method of claim 14 further comprising configuring an effective sampling rate of the digital-to-analog conversion based on predetermined configuration parameters for the plurality of digital up-converter chains and center frequencies of the plurality of frequency bands of the concurrent multi-band signal.

18. The method of claim 14 wherein an effective sampling rate of the digital-to-analog conversion is sufficient to at least be able to convert the concurrent multi-band signal plus a separation bandwidth between a first frequency band of the plurality of frequency bands and a last frequency band of the plurality of frequency bands.

19. The method of claim 15 wherein the predetermined effective sampling rate of the digital-to-analog conversion is fixed, and wherein the method further comprises digitally configuring the one or more configurable parameters to tune the concurrent multi-band signal to achieve desired carrier frequencies for the plurality of frequency bands of the concurrent multi-band signal.

* * * * *